(12) United States Patent
Price et al.

(10) Patent No.: US 11,990,484 B2
(45) Date of Patent: May 21, 2024

(54) INTEGRATED CIRCUIT ON FLEXIBLE SUBSTRATE MANUFACTURING PROCESS

(71) Applicant: PRAGMATIC PRINTING LTD., Sedgefield (GB)

(72) Inventors: Richard Price, Sedgefield (GB); Brian Cobb, Sedgefield (GB); Neil Davies, Sedgefield (GB)

(73) Assignee: PRAGMATIC PRINTING LTD., Sedgefield Durham (GB)

( * ) Notice: Subject to any disclaimer, the term of this patent is extended or adjusted under 35 U.S.C. 154(b) by 0 days.

(21) Appl. No.: 17/874,875

(22) Filed: Jul. 27, 2022

(65) Prior Publication Data

US 2022/0359579 A1 Nov. 10, 2022

Related U.S. Application Data

(63) Continuation of application No. 16/964,513, filed as application No. PCT/GB2019/050243 on Jan. 30, 2019, now Pat. No. 11,462,575.

(30) Foreign Application Priority Data

Jan. 30, 2018 (GB) ...................................... 1801457

(51) Int. Cl.
*H01L 21/78* (2006.01)
*H01L 27/12* (2006.01)

(52) U.S. Cl.
CPC .......... *H01L 27/1262* (2013.01); *H01L 21/78* (2013.01); *H01L 27/1218* (2013.01); *H01L 27/1266* (2013.01)

(58) Field of Classification Search
CPC . H01L 27/1262; H01L 21/78; H01L 27/1218; H01L 27/1266
(Continued)

(56) References Cited

U.S. PATENT DOCUMENTS 5,024,970 A * 6/1991 Mori ................... H01L 21/3081
257/E21.232
6,075,280 A 6/2000 Yung et al.
(Continued)

FOREIGN PATENT DOCUMENTS

EP 2392198 B1 8/2018
JP 2006-114574 A 4/2006
(Continued)

OTHER PUBLICATIONS

Burghartz, Joachim N., et al. "Ultra-Thin Chips and Related Applications, A New Paradigm in Silicon Technology" IEEE Xplore; Conference Paper; Oct. 2009.
(Continued)

*Primary Examiner* — Vu A Vu
(74) *Attorney, Agent, or Firm* — Jason H. Vick; Sheridan Ross, PC

(57) ABSTRACT

The present invention provides processes for manufacturing a plurality of discrete integrated circuits (ICs) on a carrier, the process comprising the steps of: providing a carrier for a flexible substrate; depositing a flexible substrate of uniform thickness on said carrier; removing at least a portion of the thickness of the flexible substrate from at least a portion of the IC connecting areas to form channels in the flexible substrate and a plurality of IC substrate units spaced apart from one another on the carrier by said channels; forming an integrated circuit on at least one of the IC substrate units.

20 Claims, 8 Drawing Sheets

(58) Field of Classification Search
USPC .......................................................... 438/15
See application file for complete search history.

(56) References Cited

U.S. PATENT DOCUMENTS

| | | | |
|---|---|---|---|
| 6,214,703 B1 | 4/2001 | Chen et al. | |
| 6,465,158 B1 | 10/2002 | Sekiya | |
| 6,498,074 B2 | 12/2002 | Siniaguine et al. | |
| 6,521,513 B1 | 2/2003 | Lebens et al. | |
| 6,528,864 B1 | 3/2003 | Arai | |
| 6,821,867 B2* | 11/2004 | Matsuura | H01L 29/66734 257/E23.179 |
| 6,829,532 B2* | 12/2004 | Obradovich | G06Q 30/02 701/425 |
| 7,452,786 B2 | 11/2008 | Dozen et al. | |
| 8,168,474 B1 | 5/2012 | Adkisson et al. | |
| 8,198,176 B2* | 6/2012 | Hatakeyama | H01L 24/29 438/464 |
| 8,877,648 B2 | 11/2014 | Bower et al. | |
| 9,423,345 B2* | 8/2016 | Avouris | H01L 21/041 |
| 9,630,389 B2 | 4/2017 | Kawata et al. | |
| 10,115,646 B2* | 10/2018 | Hoegerl | H01L 24/92 |
| 10,559,924 B2* | 2/2020 | Ochiai | H01R 13/64 |
| 10,580,932 B2* | 3/2020 | Hayashi | H01L 33/0095 |
| 10,585,932 B1* | 3/2020 | Ohsie | G06F 11/3409 |
| 10,784,164 B2 | 9/2020 | Priewasser | |
| 2009/0050352 A1 | 2/2009 | Chen et al. | |
| 2010/0317156 A1 | 10/2010 | Tsurume et al. | |
| 2012/0235315 A1* | 9/2012 | Wu | H01L 51/003 264/255 |
| 2014/0252375 A1 | 9/2014 | Briere | |
| 2015/0145137 A1 | 5/2015 | Leung et al. | |
| 2015/0231858 A1 | 8/2015 | van Neer et al. | |
| 2015/0333221 A1 | 11/2015 | Bibl et al. | |
| 2016/0050768 A1* | 2/2016 | Chen | H05K 7/06 361/728 |
| 2017/0053873 A1 | 2/2017 | Zhu | |
| 2018/0331247 A1* | 11/2018 | Lee | H01L 31/0445 |
| 2019/0067605 A1 | 2/2019 | Tanaka et al. | |
| 2021/0036034 A1 | 2/2021 | Price et al. | |

FOREIGN PATENT DOCUMENTS

| | | |
|---|---|---|
| JP | 2008-268666 A | 11/2008 |
| JP | 2014-149517 A | 8/2014 |
| JP | 2015-537371 A | 12/2015 |
| WO | WO 2010/086416 | 8/2010 |
| WO | WO 2014/054949 | 4/2014 |
| WO | WO 2015/008658 A1 | 1/2015 |
| WO | WO 2015/175131 | 11/2015 |
| WO | WO 2016/168341 | 10/2016 |
| WO | VVO 2017/154235 A1 | 9/2017 |

OTHER PUBLICATIONS

SPTS "Improving Yields with Plasma Dicing" SPTS Tech Insights; Available at https://web.archive.org/web/20170627233604/http://www.spts.com/tech-insights/advanced-packaging/plasma-dicing-1; Jun. 27, 2017.
Technical Report "Plasma Dicing Solutions of a Variety of Materials: From Silicon Wafers with Metal or Resin Layers, to Compound Semiconductor" SAMCO; Date is Unavailable.
International Search Report for International Application No. PCT/GB2019/050243, dated Apr. 10, 2019.
Written Opinion for International Application No. PCT/GB2019/050243, dated Apr. 10, 2019.
International Preliminary Report on Patentability for International Application No. PCT/GB2019/050243, dated Aug. 13, 2020.
Search Report for Great Britain Patent Application No. 1801457.1, dated Jul. 30, 2018.
Search Report for Great Britain Patent Application No. 1801457.1, dated Nov. 1, 2018.
Combined Search and Examination Report Under Sections 17 and 18(3) for Great Britain Patent Application No. GB1901234.3, dated Jun. 18, 2019.
Examination Report Under Section 18(3) for Great Britain Patent Application No. GB1901234.3, dated Nov. 19, 2021.
Office Action for U.S. Appl. No. 16/964,513, dated Nov. 3, 2021.
Office Action for U.S. Appl. No. 16/964,513, dated Feb. 17, 2022.
Notice of Allowance for U.S. Appl. No. 16/964,513, dated May 4, 2022.
Notification of Reasons for Refusal (Including Translation) for corresponding Japanese Patent Application No. 2020-539740, dated Nov. 22, 2022.
Notification for the Opinion of Examination for corresponding Taiwan Patent Application No. 108103583, dated Oct. 31, 2022.
Notification of the Reasons for Rejection (Including Translation) for corresponding Korean Patent Application No. 10-2020-7024156, dated Apr. 18, 2023.
Notification of Reasons for Refusal (Including Translation) for corresponding Japanese Patent Application No. 2020-539740, dated Aug. 1, 2023.

* cited by examiner

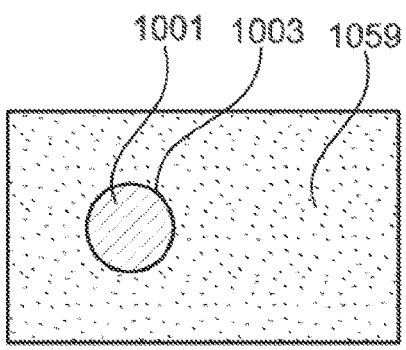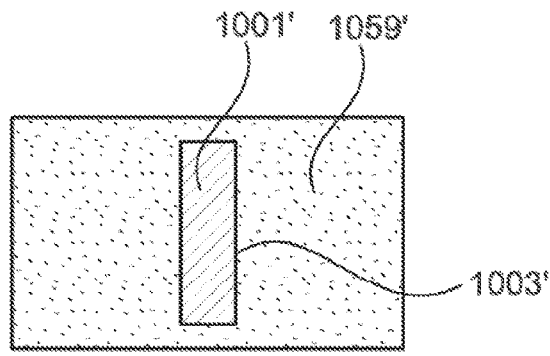
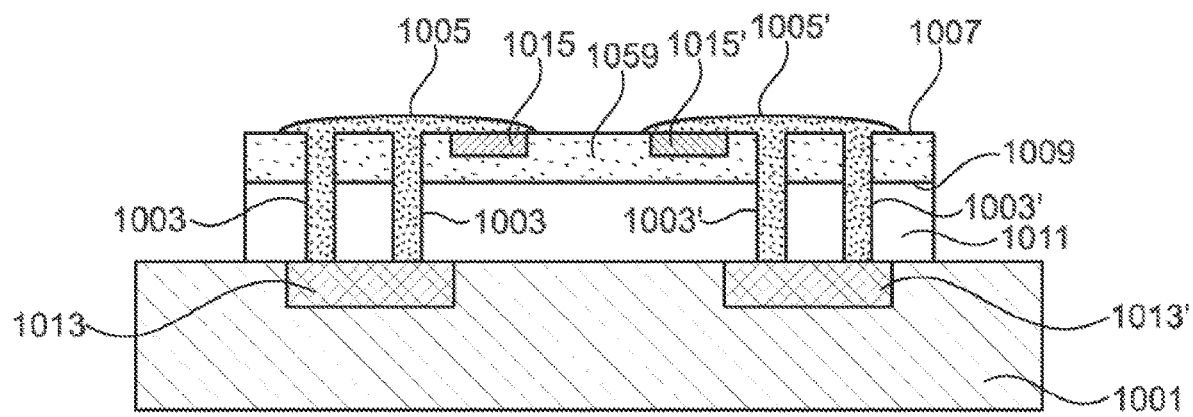
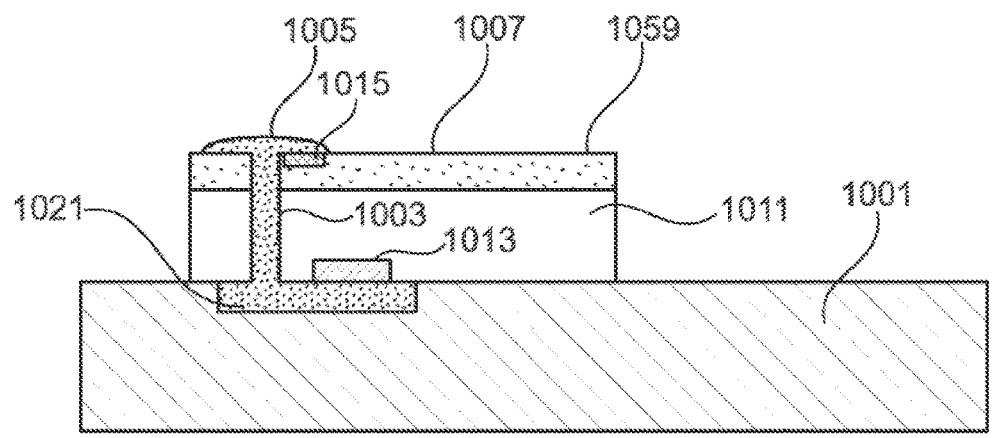

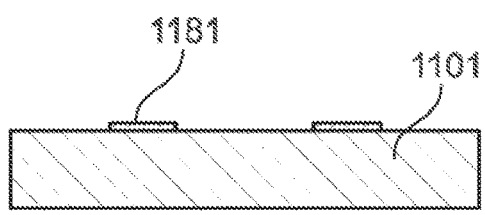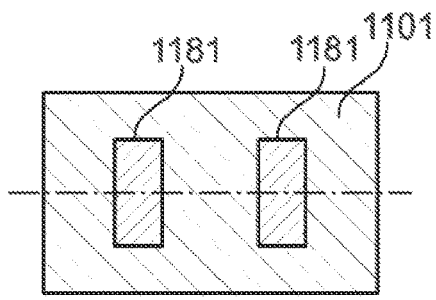
Fig. 8a
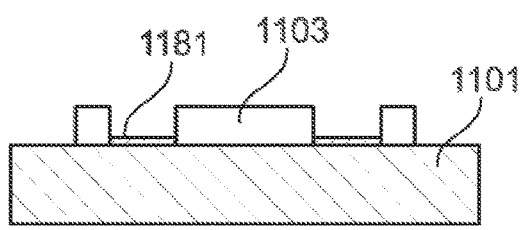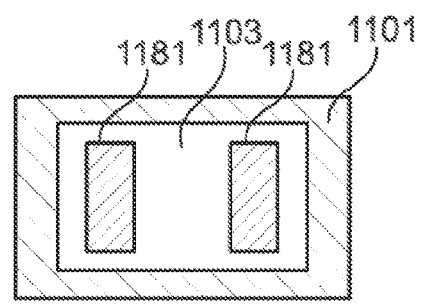
Fig. 8b
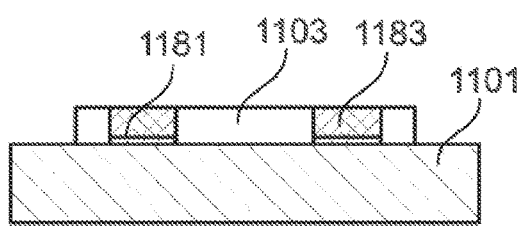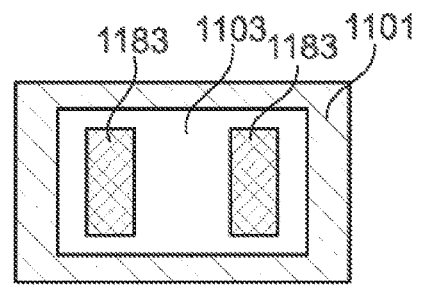
Fig. 8c
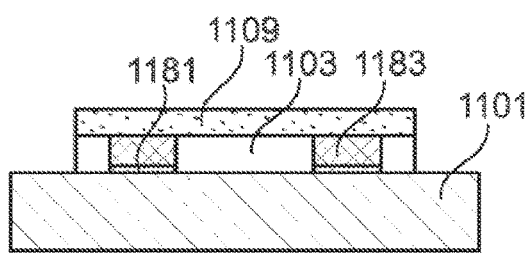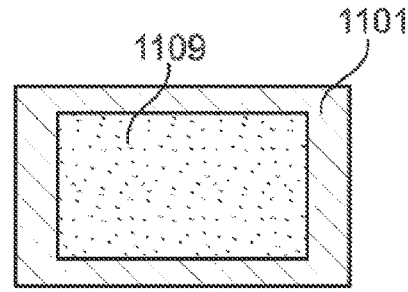
Fig. 8d
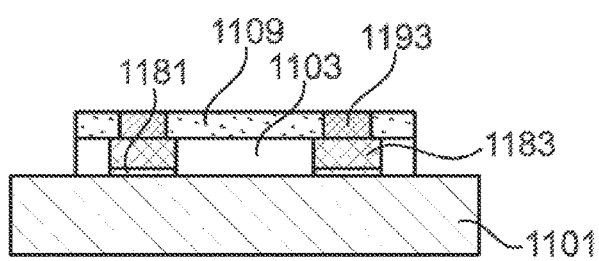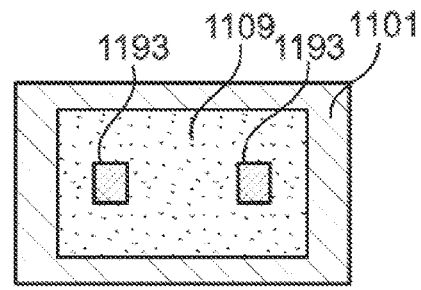
Fig. 8e

INTEGRATED CIRCUIT ON FLEXIBLE SUBSTRATE MANUFACTURING PROCESS

CROSS-REFERENCE TO RELATED APPLICATIONS

This application is a continuation of U.S. application Ser. No. 16/964,513, filed Jul. 23, 2020, now U.S. Pat. No. 11,462,575, which is a national stage application under 35 U.S.C. 371 of PCT Application No. PCT/GB2019/050243, having an international filing date of 30 Jan. 2019, which designated the United States, which PCT application claimed the benefit of Great Britain Application No. 1801457.1, filed 30 Jan. 2018, each of which are incorporated herein by reference in their entirety.

FIELD

This invention relates to a process and apparatus for manufacturing integrated circuits (ICs) and to a carrier comprising a plurality of integrated circuits. In particular, the invention relates to a process and apparatus for manufacturing a plurality of discrete ICs on a flexible substrate and to a carrier comprising a plurality of discrete integrated circuits on a flexible substrate.

BACKGROUND

Current wafer processing techniques involve placing a wafer, typically of crystallised silicon and comprising a plurality of integrated circuits (ICs) thereon, on an adhesive film on a large wafer frame. The wafer is diced before being placed into an integration machine under tension to create spaces between adjacent dies, each of the dies comprising an IC. During handling of the resulting integrated circuit (IC), a single die may then be picked up or displaced from the adhesive film and either placed directly onto a first support having corresponding contact pads during the formation of an electronic circuit, or if orientation flipping is required placed onto a second pick tool before placement onto the said support having corresponding contact pads.

In processes using a flexible plastic substrate as opposed to a silicon wafer, the same process can be accomplished, with an additional step of a release process from an initial carrier (e.g. glass, polycarbonate or quartz), supporting the flexible plastic substrate, prior to the transfer of the plastic substrate to a transfer means in an integration apparatus. This process of removal from the glass carrier results in an array of diced flexible ICs in a format that has sufficient adhesion for shipment and handling on the glass carrier, whilst also allowing for a vacuum head to remove individual flexible ICs from the glass carrier during subsequent handling.

Release processes for a flexible plastic substrate, on which the electronics (e.g. integrated circuits) are laid, from the carrier (e.g. glass, polycarbonate or quartz) typically involve treatment from the backside of the carrier with an electromagnetic radiation source (e.g. a laser, flashlamp, high powered LED, an infrared radiation source or the like). The mechanism will depend on whether the electromagnetic radiation source causes predominantly a photonic ablation (through absorption) or a thermal process (e.g. heat-release). Optionally an adhesive/release material can be employed between the carrier and the flexible plastic substrate. The laser is scanned at fixed, discrete intervals across the surface. The laser modifies the interface between the flexible plastic substrate (e.g. a film) and the glass carrier, either by local ablation of a thin layer of substrate, or by reducing bond strength. Control of the laser to achieve this balanced release in a uniform manner has proven difficult with a narrow process window.

In conventional processes, singulating the ICs on a substrate (wafer), flexible or rigid, is performed by 'dicing', that is cutting the substrate along straight lines between the ICs after they are formed in a process known as 'back end processing' and, if the wafer is flexible, subsequently releasing the discrete ICs to form singulated ICs. When dicing flexible substrates this conventional approach is often performed by a laser or abrasive water jet. Such processes are time-consuming and produce 'dirty' waste material that must be removed from the completed substrate (wafer). Furthermore, the processes may generate significant local heating of the substrate and may produce poor edge quality around each singulated IC. In addition, the scribe line width formed between each of the discrete ICs in the dicing process may be at least 10 μm which width is a waste of valuable substrate.

BRIEF SUMMARY OF THE DISCLOSURE

Accordingly, it is an object of certain embodiments of the invention to provide a process and apparatus for manufacturing a plurality of integrated circuits which overcome, at least partly, one or more of the problems associated with the prior art.

Aspects and embodiments of the invention provide a process for manufacturing a plurality of discrete integrated circuits, apparatus for manufacturing a plurality of discrete integrated circuits and a carrier comprising a plurality of discrete integrated circuits on a flexible substrate as claimed in the appended claims.

According to a first aspect of the invention there is provided a process for manufacturing a plurality of discrete integrated circuits (ICs) on a carrier, the process comprising the steps of:

providing a carrier for a flexible substrate;
depositing a flexible substrate of uniform thickness on said carrier;
patterning said uniform thickness flexible substrate to define a plurality of IC substrate areas spaced apart from one another by a plurality of IC connecting areas;
removing at least a portion of the thickness of the flexible substrate from at least a portion of the IC connecting areas to form channels in the flexible substrate and a plurality of IC substrate units spaced apart from one another on the carrier by said channels;
forming an integrated circuit on at least one of the IC substrate units.

According to a second aspect of the invention there is provided a process for manufacturing a plurality of discrete integrated circuits (ICs) on a carrier, the process comprising the steps of:

providing a carrier for a flexible substrate;
depositing a flexible substrate of uniform thickness on said carrier;
patterning said uniform thickness flexible substrate to define a plurality of IC substrate areas spaced apart from one another by IC connecting areas;
forming a portion of an integrated circuit on at least one of the IC substrate areas;
removing at least a portion of the thickness of the flexible substrate from at least a portion of the IC connecting areas to form channels in the flexible substrate and a plurality of IC substrate units spaced apart from one another on the carrier by said channels; and
completing the formation of the integrated circuit on the at least one of the IC substrate areas.

Unless otherwise stated, the following embodiments are embodiments of both the first aspect and the second aspect of the invention.

In certain embodiments the process comprises the step of pre-treating the carrier (or other layer beneath the substrate) to prevent the flexible substrate from adhering to the carrier in the IC connecting areas. More specifically, the carrier (or other layer beneath the substrate) may be subjected to a plasma treatment in the areas that will become the IC connecting areas. In certain embodiments a material may be deposited in the areas that will become the IC connecting areas. In certain embodiments a material is deposited on the carrier (or other layer beneath the substrate) in a pattern in the areas that will become the IC connecting areas. In this way the carrier (or other layer beneath the substrate) can be pre-treated to prevent the flexible substrate from adhering to the carrier (or other layer beneath the substrate) in those pre-treated areas. The pre-treatment occurs before deposition of the substrate on the carrier (or other layer beneath the substrate).

In certain embodiments the steps of depositing a flexible substrate of uniform thickness on said carrier and patterning said uniform thickness flexible substrate to define a plurality of IC substrate areas spaced apart from one another by a plurality of IC connecting areas are a single step comprising selective deposition of a pattern of flexible substrate of uniform thickness on said carrier.

In certain embodiments, the flexible substrate is between about 0.5 μm and about 20 μm thick when deposited. More specifically, the flexible substrate is between about 1 μm and about 10 μm. In certain embodiments the flexible substrate is about 5 μm thickness when deposited.

In certain embodiments the process comprises forming integrated circuits on each of the IC substrate units.

In certain embodiments each IC substrate unit comprises flexible substrate of uniform thickness.

In certain embodiments the process comprises the step of removing the entire thickness of the flexible substrate from all of each of the IC connecting areas so as to form a plurality of substrate-free channels on the carrier between each adjacent IC substrate unit on the carrier.

In certain embodiments the process comprises removing the entire thickness of the flexible substrate from a portion of each of the IC connecting areas so as to form a plurality of patterned channels on the carrier wherein at least one channel is formed between each of the IC substrate units.

In certain embodiments the process comprises removing a portion of the thickness of the flexible substrate from each of the IC connecting areas so as to form a plurality of channels on the carrier, wherein each channel comprises interconnecting portions of substrate between adjacent IC substrate units.

In certain embodiments the flexible substrate interconnecting portions connecting adjacent IC substrate units in the channels are about 100 nm to about 200 nm thick, and the IC substrate units are between about 0.5 μm and about 20 μm thick. More specifically, the flexible IC substrate units are each between about 1 μm and about 10 μm thick. In certain embodiments the flexible IC substrate units are each about 5 μm thickness when deposited. In this way, the substrate interconnecting portions form a bridge between adjacent IC substrate units. This has the advantage that when the substrate is released from the carrier, the IC substrate units remain connected by the interconnecting portions until such time as IC integration is initiated.

In certain embodiments the process comprises removing a first portion of the thickness of the flexible substrate from a first portion of each of the IC connecting areas and removing a second portion of the thickness of the flexible substrate from a second portion of each of the IC connecting areas.

In certain embodiments the first portion is of greater thickness than the second portion.

In certain embodiments the process comprises forming perforation lines between adjacent IC substrate units in the IC connecting areas by sequentially removing and leaving the entire thickness of the flexible substrate along each of the IC connecting areas so as to form a plurality of patterned channels on the carrier wherein at least one channel is formed between each of the IC substrate units.

In certain embodiments the process comprises forming perforation lines between adjacent IC substrate units in the IC connecting areas by sequentially removing a first portion of the thickness of the flexible substrate from a first portion of each of the IC connecting areas and removing a second portion of the thickness of the flexible substrate from a second, different portion of each of the IC connecting areas, wherein the first portion is of greater thickness than the second portion.

In certain embodiments the process comprises forming perforation lines between adjacent IC substrate units in the IC connecting areas by sequentially removing the entire thickness of the flexible substrate and a partial thickness of the flexible substrate along each of the IC connecting areas so as to form a plurality of patterned channels on the carrier wherein at least one channel is formed between each of the IC substrate units.

In certain embodiments the process comprises forming at least one structure in an IC connecting area by removing the entire thickness of the flexible substrate from a portion of the IC connecting area so as to form a channel having at least one structure of flexible substrate in the channel, the structure being spaced apart from the IC substrate units adjacent to the channel.

In certain embodiments the structure is a test structure. In this way, the pattern alignment and/or etching for the substrate and/or one or more layers of the IC during formation thereof can be tested and verified to ensure each layer is patterned and formed in alignment with previously deposited layers. In certain embodiments test structures can be used to gather information about any desired aspect of the process, devices and/or circuits.

In certain embodiments the process comprises depositing a filler in the channels, the channels being either substrate-free or patterned.

In certain embodiments the filler is removably deposited in the channels (e.g. substrate free or patterned).

In certain embodiments, the filler is deposited in the channels (e.g. substrate free or patterned) so as to fill the channels. In this way, the channels are filled completely to the level of the upper surface of the IC substrate units such that the IC substrate units (or the IC formed thereon) and the upper surface of the filler in the channels are substantially co-planar. In this way, subsequent processing during IC manufacture may be improved (e.g. made easier).

Thus, the channels or 'lanes' between the patterned IC substrate units (that subsequently have ICs deposited upon them) may be patterned, and optionally removed, repeatedly during IC formation as layers are deposited. In an alternative approach, following initial patterning of the substrate and formation of the IC substrate units, the channels between IC substrate units may be filled with a material that may be easily removed, for example, at the IC singulation stage. This approach is applicable to processes in which the channels between IC substrate units are completely removed and to those in which the substrate is only partially removed from the IC connecting areas, e.g. leaving behind some substrate connecting adjacent IC substrate units.

In certain embodiments, upon completion of the formation of an integrated circuit the material used to fill the channels and any layers deposited on top of them may be removed by chemical processing, e.g. wet or dry etching.

In certain embodiments, the IC substrate units are formed by patterning the flexible substrate by photolithography or selective deposition.

In certain embodiments, the filler deposited in the channels between IC substrate units is a metal. More specifically, the metal filler is one or more of: nickel, copper, silver, gold and palladium.

In certain embodiments, the filler is applied by electroless plating, e.g. of nickel, copper, silver, gold, palladium or any suitable alternative. This enables the wafer comprising the flexible substrate and filler to be substantially planarized. In this way, any deleterious effects arising in subsequent deposition and etching steps in IC manufacture may be reduced. Once IC manufacturing is complete, the ICs may be singulated on the carrier (e.g. glass) using an appropriate chemical process, such as wet or dry etching, to selectively detach the channel fillings (e.g. metal) and the layers deposited onto them. Many suitable chemical processes are known in the art, for example there are selective etchants for copper and nickel that would not etch aluminium.

In certain embodiments, the bottom of the channel is cleared of filler if the aspect ratio of the channel is not too high, and the channel is not too narrow. More specifically, the bottom of the channel is cleared of filler when the channel is greater than about 1 micron width.

In certain embodiments, a mask protecting the integrated circuit of the at least one IC substrate unit is provided. This is advantageous in a dry-etch process for example.

In certain embodiments, the filler is a polymer. More specifically, the polymer filler differs from the polymer of the flexible substrate.

In certain embodiments, the flexible substrate is formed from one of: PEN (polyethylene naphthalate) and PI (polyimide). In these embodiments, the channels may be filled with a different polymer, being one of: PMMA (polymethyl methacrylate) and PVA (polyvinyl acetate).

In certain embodiments, after integrated circuits are formed on the IC substrate units, the IC substrate units may be singulated by using a suitable process, for example a solvent process or a wet or dry etching process, to selectively remove the channel-filling polymer. In certain embodiments, depending on the processes used to form integrated circuits on the IC substrate units, it may be necessary to protect the channel-filling polymer with a capping layer to prevent its removal during integrated circuit formation. Any such capping layer may be patterned to align with only the channels between IC substrate units, or it may additionally substantially cover the upper surfaces of the IC substrate units. In certain embodiments, the capping layer may be removed from the channel-filling polymer at an appropriate point prior to integrated circuit singulation.

In certain embodiments, prior to, or after, depositing the flexible substrate onto the carrier, the process may comprise the step of applying a metal seeding layer.

In certain embodiments the metal seeding layer is applied using any suitable deposition technique. In certain embodiments, the metal seeding layer is applied using sputtering. It should be understood that any other appropriate patterning and deposition techniques may be used to apply the metal seeding layer.

In certain embodiments the metal seeding layer is patterned using lithography or etching.

In certain embodiments the metal seeding layer is applied in a pattern. More specifically, the metal seeding layer is applied in a pattern which will match, or substantially match, the pattern of the IC connecting areas. In this way, the channels formed by complete removal of the substrate in the IC connecting areas will expose the metal seeding layer. Alternatively, the metal seeding layer is applied in a pattern in the channels between the IC substrate units. More specifically, the metal seeding layer is applied after the deposition of the flexible substrate and the formation of the channels in the substrate.

Thus, once the pattern of the metal seeding layer is applied, the flexible substrate is deposited, if not done previously, and patterned so as to form the channels, that is to say either the channels are etched in a flexible substrate layer deposited over the metal seeding layer, or flexible substrate is selectively deposited between the metal seeding channels.

After the IC substrate units have been formed by patterning the flexible substrate and removing the channels, a further (thicker) layer of metal is grown on the metal seeding layer to fill the channels between IC substrate units. This may be performed by any suitable known technique, such as chemical vapour deposition, physical vapour deposition, electroplating, electroless plating, or the like.

In certain embodiments, through-chip vias and/or bottom-side integrated circuit contact pads may be formed. More specifically, initial patterning of the metal layer may include applying metal layer or metal seeding layer features within the boundaries of subsequently formed IC substrate units, either in addition to or instead of any such patterning in the channels between IC substrate units.

Alternatively, in certain embodiments the metal layer, e.g. metal seeding layer or other metal layer deposited by electroplating, vapour deposition, etc., may be applied after the IC substrate units and their internal features (e.g. internal vias) have been formed. More specifically, internal features of the IC substrate units may be formed and filled in addition to, or instead of, the channel features as previously described in relation to metal seeding and/or metal filling steps. If metal seeding is performed, once the flexible substrate and metal seeding layers have been patterned a thicker layer of metal is grown on the metal seeding layer to substantially fill the internal features of the IC substrate units.

In certain embodiments, the metal layer may be grown or deposited up to the upper surface of the IC substrate units.

In certain embodiments, during the subsequent process of IC formation on the IC substrate units, IC wiring (e.g. metal tracks) may be connected to the metal deposited onto the internal features. Following completion (which may include deposition of further layers) and singulation of the IC and its separation from the carrier, the internal features form contact pads on the underside of the IC ('bottom-side contacts'). The contact pads may be connected to application circuits, e.g. antennas, without inverting the IC, which simplifies the assembly process.

By building up further layers of metal on top of the metal-filled internal features, it is possible to produce 'through-chip vias', that, is conductive features running between the upper surface of the IC and the lower surface of the IC. This allows for "stacking" of ICs and/or other components in the same physical area, or overlapping areas, on the application substrate. This can save area and reduce metal tracking of interconnects, reducing cost of the application circuit by either simply reducing area and tracking, or also in some cases by eliminating the need for "crossovers" in metal tracking on the application circuit, reducing the number of required fabrication steps.

In certain embodiments, contact pads can be produced by applying a metal layer to the carrier prior to depositing the flexible substrate. Alternatively, in certain embodiments, contact pads can be produced by depositing flexible substrate first then the metal layer.

In certain embodiments, metal contact pads are patterned directly on the carrier (e.g. glass) by applying the metal layer in a discrete pattern on the carrier. The flexible substrate is subsequently deposited onto the metal layer.

In certain embodiments, vias are then etched through the flexible substrate layer (e.g. with an oxygen plasma dry etch for polyimide films), and connections made to the upper layers. In certain embodiments, these connections are made by applying an upper metal layer to the flexible substrate. In such embodiments, the upper metal layer routes over positively sloped sidewalls around the etched vias to form connections, or fills the vias (using methods such as electro/electro-less plating techniques). In this method, the vias in the flexible substrate connecting to the bottom pad could consist of a limited area, with the pad extending beyond them.

In certain embodiments, a flexible substrate (e.g. plastic film) is deposited on the carrier (e.g. glass), followed by the etching of the vias through the flexible substrate. In certain embodiments, the via is narrower at the bottom than at the top (i.e. the via walls are converging towards the bottom). Subsequently, a metal layer is deposited, allowing for no breakages at the via edges, thus routing the metal both down to contact the carrier, and up to the top of the substrate layer. The bottom contact pad area is defined in this method by the size of the via, leading to large etched regions of the flexible substrate. In other words, deposition of a metal contact pad prior to deposition of the IC substrate unit optionally allows that contact pad to be larger in area than an internal feature (e.g. an internal via) subsequently formed above it and filled with metal to connect to it. In contrast, bottom side contacts formed only after deposition of the IC substrate unit may be limited in area to that of the internal feature.

In certain embodiments, in order to ensure proper release of the metal contact pad areas from the carrier, a release layer may be applied underneath the metal contact pad. The release layer is designed to interact with a laser used for release and to result in complete release of the metal contact pad area from the carrier.

In certain embodiments, the release layer comprises a titanium interfacial layer under an aluminium contact pad.

In certain embodiments the IC substrate units on the carrier are uniform in shape. More specifically the IC substrate units are polygonal. In this way, a large number of IC substrate units can be formed on the carrier without large areas of wasted substrate.

Alternatively, the IC substrate units are irregular in shape. In this way, the shape of the IC substrate units and the ICs formed thereon may form a security and traceability feature of the product.

In certain embodiments at least one edge of at least one of the IC substrate units on the carrier comprises at least one indentation.

In certain embodiments the edge comprises a series of indentations. In this way, the edge profiling of a least one IC substrate unit provides an identification code by which a carrier and, more particularly the substrate and the ICs formed thereon can be tracked through the manufacturing process and beyond.

In certain embodiments the carrier is rigid. More specifically the carrier is glass, polycarbonate or quartz.

In certain embodiments the carrier is flexible. More specifically the carrier is a flexible release tape.

In certain embodiments at least a portion of the flexible substrate is removed from the IC connecting areas to form channels in a pattern at predetermined location(s) on the carrier.

In certain embodiments the pattern is formed of a series of intersecting channels extending between the edges of the carrier.

In certain embodiments the pattern of channels is uniform across the carrier.

In certain embodiments the pattern of channels is non-uniform across the carrier.

In certain embodiments the flexible substrate is formed of a single layer.

In certain embodiments the flexible substrate material is a polymer.

In certain embodiments the flexible substrate material comprises one or more of polyimide, polyethylene terephthalate (PET), parylene, benzocyclobutene, amorphous fluoropolymer e.g. Cytop™ (AGC Chemicals Europe), negative epoxy photoresist e.g. SU-8 (MicrChem), hydrogen silsesquioxane (HSQ) and poly(aryl ether ketone) (PEEK).

In certain embodiments the flexible substrate comprises a layered structure comprising two polymer substrate layers spaced apart from one another by an interlayer (e.g. an inorganic layer such as silicon nitride, silicon dioxide or aluminium oxide). In this way, curling of the flexible substrate is mitigated or prevented.

In certain embodiments the flexible substrate material comprises one or more of: a metal oxide, a metal phosphate, a metal sulphate, a metal sulphite, a metal nitride, a metal oxynitride, an inorganic insulator and a spinnable glass.

In certain embodiments the interface between the carrier and the flexible substrate is formed by direct adhesion of the flexible substrate to the carrier.

In certain embodiments the interface comprises an interlayer.

In certain embodiments the interlayer comprises an adhesive.

In certain embodiments the interlayer comprises titanium metal.

In certain embodiments the interlayer is patterned.

In certain embodiments the process comprises the step of singulating the IC substrate units by releasing each of them from the carrier following the completion of the IC formation process thereon.

According to a third aspect, the present invention provides a process for manufacturing a plurality of discrete integrated circuits (ICs) on a carrier, the process comprising the steps of:
providing a carrier for a flexible substrate;
depositing a pattern of a flexible substrate of uniform thickness on said carrier, wherein said pattern of said uniform thickness flexible substrate defines a plurality of IC substrate areas spaced apart from one another by a plurality of IC connecting areas;
forming an integrated circuit on at least one of the IC substrate units.

In certain embodiments the process comprises forming integrated circuits on each of the IC substrate units.

In certain embodiments the IC substrate units on the carrier are uniform in shape.

In certain embodiments the IC substrate units are polygonal.

In certain embodiments the IC substrate units are irregular in shape.

In certain embodiments at least one edge of at least one of the IC substrate units on the carrier comprises at least one indentation.

In certain embodiments the edge comprises a series of indentations.

In certain embodiments the carrier is rigid.

In certain embodiments the carrier is glass, polycarbonate or quartz.

In certain embodiments the carrier is flexible.

In certain embodiments the carrier is a flexible release tape.

In certain embodiments at least a portion of the flexible substrate is deposited in a pattern so as to provide the IC connecting areas in the form of channels in a pattern at predetermined location(s) on the carrier.

In certain embodiments the pattern is formed of a series of intersecting channels extending between the edges of the carrier.

In certain embodiments the pattern of channels is uniform across the carrier.

In certain embodiments the pattern of channels is non-uniform across the carrier.

In certain embodiments the flexible substrate is formed of a single layer.

In certain embodiments the flexible substrate material is a polymer.

In certain embodiments the flexible substrate material comprises one or more of polyimide, polyethylene terephthalate (PET), parylene, benzocyclobutene, Cytop™ (AGC Chemicals Europe), negative epoxy photoresist e.g. SU-8 (MicrChem), hydrogen silsesquioxane (HSQ) and Polyaryletheretherketone (PEEK)

In certain embodiments the flexible substrate comprises a layered structure comprising two polymer substrate layers spaced apart from one another by an interlayer (e.g. an inorganic layer such as silicon nitride, silicon dioxide or aluminium oxide).

Unless otherwise stated, the embodiments described in respect of the first and second aspects of the invention are embodiments of the third aspect of the invention.

According to a further aspect, the present invention provides an apparatus arranged to implement a process in accordance with the present invention.

According to a further aspect, the present invention provides a carrier comprising a plurality of discrete ICs formed in accordance with a process of the invention.

According to a yet further aspect, the present invention provides a carrier comprising a plurality of discrete ICs wherein at least one of the plurality of discrete ICs comprises a first electrical contact pad, at least one second electrical contact pad, and an insulating member comprising a bridging insulating portion and a laterally extending insulator portion extending from the bridging insulating portion. Thus, the first electrical contact pad is electrically isolated from the second electrical contact pad, so that each of the first and second electrical contact pads can be connected to application circuit tracks where the end portions are electrically separated from one another.

In certain embodiments the laterally extending insulator portion extends substantially from an end of the bridging insulating portion.

In certain embodiments, the insulating member is formed of flexible substrate.

In certain embodiments, the bridging insulating portion electrically isolates the first electrical contacting element and the second electrical contacting element from one another.

In certain embodiments, at least one of the first electrical contact pad and the at least one second electrical contact pad is located on the laterally extending insulator portion.

In certain embodiments, the other of the at least one of the first electrical contact pad and the at least second electrical contact pad is located at an end of the bridging insulating portion remote from the laterally extending insulator portion. In this way, the first electrical contact pad and the second electrical contact pad are separated apart from each other, allowing the IC to bridge across a greater distance.

In certain embodiments, the insulating member is any one of the following shapes: Z-shape, L-shape, I-shape, C-shape, T-shape or W-shape. Thus, the shape of the IC can be chosen to match the required application based on the configuration of the application circuit tracks, or the arrangement of application circuit contacts, that the IC is applied upon. For example, the application of the IC may be constrained, for example, by the footprint area of its circuitry or the minimum contact pad separation.

In certain embodiments, the bridging insulating portion has a width less than that of the laterally extending insulator portion. Thus, the footprint of the IC is further reduced, maximising the efficient carrier footprint coverage during manufacture and maximising the IC cost reduction potential.

In certain embodiments, the bridging insulating portion has a uniform width.

In certain embodiments, the bridging insulating portion has a non-uniform width.

In certain embodiments, the first electrical contact pad and the at least second electrical contact pad are each located on the substrate.

In certain embodiments, the laterally extending insulator portion extends from the bridging insulating portion at an angle of 1° to 179°.

In certain embodiments, the laterally extending insulator portion extends substantially perpendicularly from the bridging insulating portion. In this way, the ICs may be conveniently designed upon, or applied to circuitry which is designed upon, perpendicular grids. These grids are a common pattern that IC design automation and assembly tools are designed to produce.

In certain embodiments, the IC comprises a second laterally extending portion.

In certain embodiments, the electrical circuit comprising the IC is electrically connected to an application circuit at the first electrical contact pad and the at least second electrical contact pad of the integrated circuit.

In certain embodiments, the application circuit comprises: a first circuit contact and a second circuit contact.

In certain embodiments, the first circuit contact is adapted to electrically contact an electrical contact pad of the IC.

In certain embodiments, the second circuit contact is adapted to electrically contact a second electrical contact pad of the IC.

In certain embodiments, the application circuit further comprises at least one application circuit feature interposed between the first circuit contact and the second circuit contact. In this way, the contact pads of the IC can contact the first and second circuit contacts, allowing the IC to bridge across the at least one application circuit feature interposed between the first and second circuit contacts and without making electrical contact with the at least one application circuit feature.

In certain embodiments, at least one of the first circuit contact and the second circuit contact is operable to be angled relative to at least one of the electrical contact pads. In this way, the shape of the IC may be adapted to contact application circuit tracks which are non-parallel to one another, increasing the range of applications of the IC.

In certain embodiments, an integrated circuit assembly comprises a plurality of the ICs.

In certain embodiments, the carrier comprises a plurality of the ICs arranged in a repeated pattern. In certain embodiments, the pattern is a tessellated pattern. Thus, the carrier footprint coverage by the ICs is maximised, allowing for more efficient use of carrier surface area.

BRIEF DESCRIPTION OF THE DRAWINGS

Embodiments of the present invention will now be described with reference to the accompanying drawings of which:

FIGS. 7a and 7b show a carrier comprising an IC formed on a discrete substrate unit;

FIGS. 7c and 7d show a carrier comprising an IC formed on a discrete substrate unit comprising electrical connections made through the IC layer and the substrate layer onto the carrier in an embodiment of the present invention;

FIGS. 8a to 8e show a method for patterning channels in a metal seeding layer.

DETAILED DESCRIPTION

Referring now to FIGS. 1a to 1d this shows the formation of a plurality of discrete ICs on a patterned substrate on a carrier formed in accordance with an embodiment of the process of the invention.

Figure 1A:
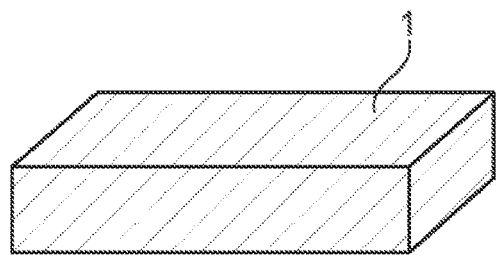
FIGS. 1a to 1d show the formation of a plurality of discrete ICs on a patterned substrate on a carrier formed in accordance with an embodiment of the process of the invention.
Figure 1B:
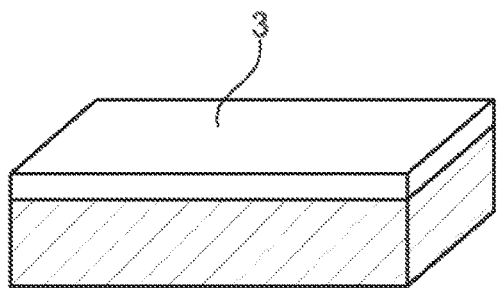

As seen in FIGS. 1a and 1b, a flat glass carrier is provided onto which a layer of polyimide substrate 3 is deposited. The polyimide substrate layer has a uniform thickness across the glass carrier 1. A lithographic printing technique is used to pattern the polyimide substrate 3 (see FIG. 1c) to define a plurality of IC substrate areas 5 spaced apart from one another by a plurality of IC connecting areas 7. The IC connecting areas 7 cross the substrate 3 from edge to edge both longitudinally and transversely to form a pattern of intersecting lines 7 and a plurality of uniform IC substrate areas 5.

The substrate 3 is then removed by etching, e.g. developing away exposed parts of substrate 3 contained within the IC connecting areas 7, exposing the carrier 1 and forming channels in the flexible substrate 3. The plurality of IC substrate units 5 are spaced apart from one another on the carrier 1 by the channels.

Figure 1C:
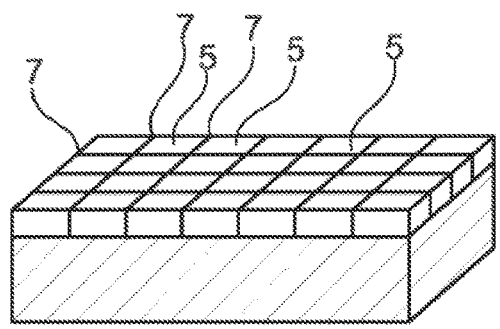
Figure 1D:
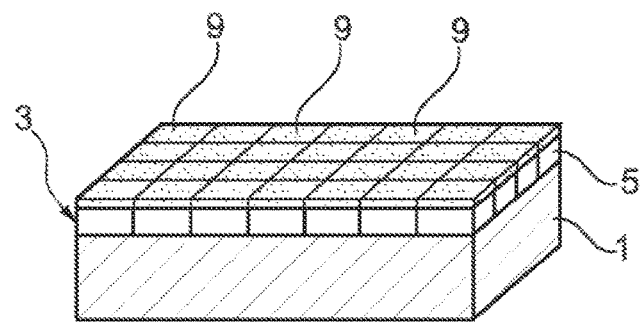

As seen in FIG. 1d, layers of an integrated circuit 9 are then formed on each of the IC substrate units 5 to form a plurality of discrete integrated circuits 9 on the substrate 3 and spaced apart from each other by channels.

Each discrete IC 9 can then be singulated by removing same and its substrate unit 5 from the carrier 1 (not shown).

In a variation of the process (not shown), following deposition and patterning of the flexible polyimide substrate layer to define a plurality of IC substrate areas spaced apart from one another by IC connecting areas, a portion of an integrated circuit is formed on each of the IC substrate areas. Thereafter, the flexible substrate is removed from the IC connecting areas by etching the substrate from the carrier to form channels in the flexible substrate and a plurality of discrete, partially formed IC substrate units spaced apart from one another on the carrier by said channels. Once the channels have been formed in the substrate, formation of the integrated circuit on the IC substrate units is completed.

As illustrated in FIGS. 1a to 1f, IC substrate units 5 are formed as discrete units on carrier 1 prior to completion of the formation of the IC 9 on the substrate unit 5. At one or more stages in IC manufacture, lithographically-defined patterning and subsequent etching removes substantially all material layers, including the substrate layer 3 lying outside the boundaries of each IC substrate unit 5 at that stage exposing the carrier 1 in the channels (see 11 in FIGS. 1e and 1f) between the IC substrate units 5. This may be performed after deposition of the substrate layer 3 onto a carrier 1, in which case the boundaries of each IC 9, and any spaces and/or structures between and within them, are defined in that substrate layer 3. The substrate layer 3 can then be patterned in this way either in process steps directly following deposition of the substrate 3 (FIGS. 1a to 1d), or in any subsequent material removal step that employs a suitable technique, e.g. an etching technique to which the substrate 3 is sensitive. Material subsequently deposited on the IC substrate units 5 during the IC manufacturing process, e.g. semiconducting, conducting or insulating material, may be removed from outside the IC substrate unit 5 boundaries and any spaces or structures between or within them, in one or more subsequent etching steps. In this way insulating, conducting and semiconducting material lying outside the IC substrate unit 5 boundaries is removed at any suitable step in the IC formation process that employs a compatible material patterning and/or removal technique.

More than one layer of material may be removed in any one etching step, so that IC substrate unit boundaries are defined fewer times during the manufacturing process.

It will be understood that measures need to be taken to maintain the small distances, i.e. channels, between IC substrate units, in particular if thick layer(s) of IC material are etched in a single step. By way of example, if etching to remove several μm (e.g. 0.25 μm to 10 μm, preferably 0.5 μm to 2 μm) in thickness of polymer material(s) occurs in one step, an oxygen plasma etch may produce IC substrate unit boundaries that are relatively perpendicular to the plane of the substrate, in a short time. This may allow a scribe line width of less than 10 μm to be achieved. Channels of less than 10 μm width result in less material wastage during the formation of a plurality of discrete ICs on a carrier. In certain arrangements, the etching process can be optimised to be largely anisotropic (predominantly z-axis).

Figure 1E:
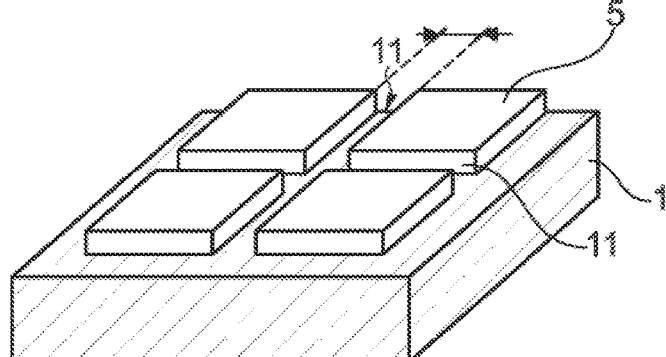
FIGS. 1e to 1f show the formation of a plurality of discrete ICs on a patterned substrate on a carrier formed in accordance with an embodiment of the process of the invention.
Figure 1F:
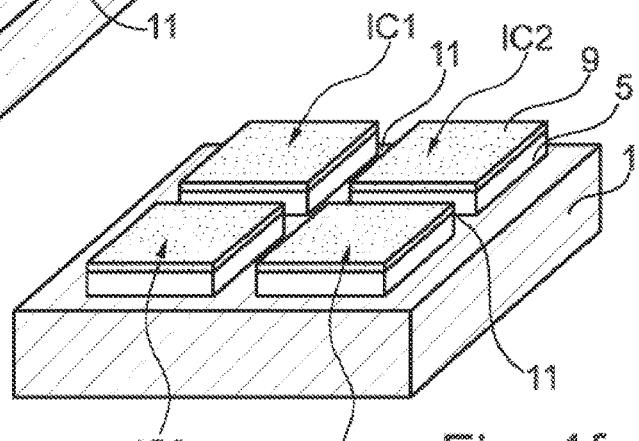

As shown in FIGS. 1e and 1f, an embodiment of the process for manufacturing a plurality of discrete integrated circuits (ICs) on a carrier, comprises providing a glass carrier 1 and printing a pattern of a discrete flexible polyimide substrate units 5 of uniform thickness on the glass carrier 1. The pattern of discrete polyimide substrate units 5 are spaced apart from one another by a plurality of channels 11 exposing the glass carrier 1 between the substrate units 5. As shown in FIG. 1f, integrated circuits 9 are then formed on each of the discrete polyimide substrate units 5 by depositing layers comprising devices and/or electrical interconnection networks to form the IC 9 on the substrate unit 5. In the embodiment depicted in FIGS. 1e and 1f, each polyimide substrate unit 5 has an IC 9 formed thereon. In alternative embodiments (not shown), ICs may be formed on some, but not all of the polyimide substrate units.

The pattern of discrete flexible polyimide substrate units are formed of one or more selectively deposited (e.g. by printing) substrate layers, so that initial formation of discrete substrate units 5 on the carrier 1 does not require lithographically-defined patterning. In other variations, other layers of the IC (e.g. conductor, insulator, semiconductor) are selectively deposited onto the substrate units 5 to reduce the number of lithographic patterning steps required to maintain the substrate units and ICs thereon as discrete units.

Figure 2:
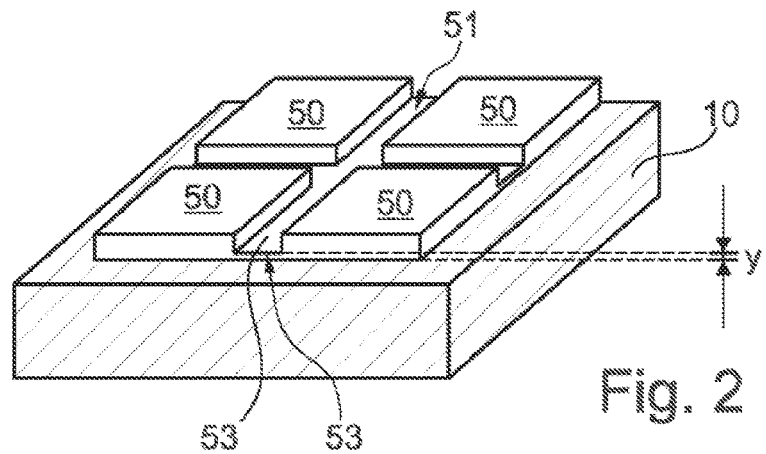
FIG. 2 is a diagrammatic representation of a patterned substrate for a plurality of discrete ICs on a carrier formed in accordance with an embodiment of the process of the invention.

FIG. 2 shows an alternative substrate unit formation in which polyimide substrate units 50 are formed on a polycarbonate carrier 10. A uniform thickness of substrate 3 is initially deposited on carrier 10 and patterned by lithographic patterning as shown in FIGS. 1b and 1c. The discrete polyimide substrate units 50 are formed by removal (e.g. by etching) of a partial thickness of substrate material 3 from the IC connecting areas (7 in FIG. 1c) to form channels 51 in which an interconnecting portion 53 of polyimide substrate 3 remains between adjacent substrate units 50. This could alternatively be achieved by the positive photoresist process described above but with an under-develop after exposure to ensure that some of the exposed channels remain.

The interconnecting portions 53 of substrate material 3, having a thickness "y", form one or more physical connections between adjacent IC substrate units 50. In this way, the first substrate layer 3 is patterned and etched so that the substrate 3 lying outside the IC substrate unit 50 boundaries is thinner than that lying inside the boundaries of the IC substrate units 50. The substrate 53 connecting adjacent IC substrate units in the channels 51 is approximately 100-200 nm thick, whereas the IC substrate units are about 5 μm when deposited. This thin connecting material 53 is left in place to improve handling of the flexible substrate, e.g. to hold the IC substrate units 50 comprising the ICs (not shown) in place, prior to singulation of the IC substrate units 50 by removing them from the carrier 10 and integration of the ICs.

Figure 3:
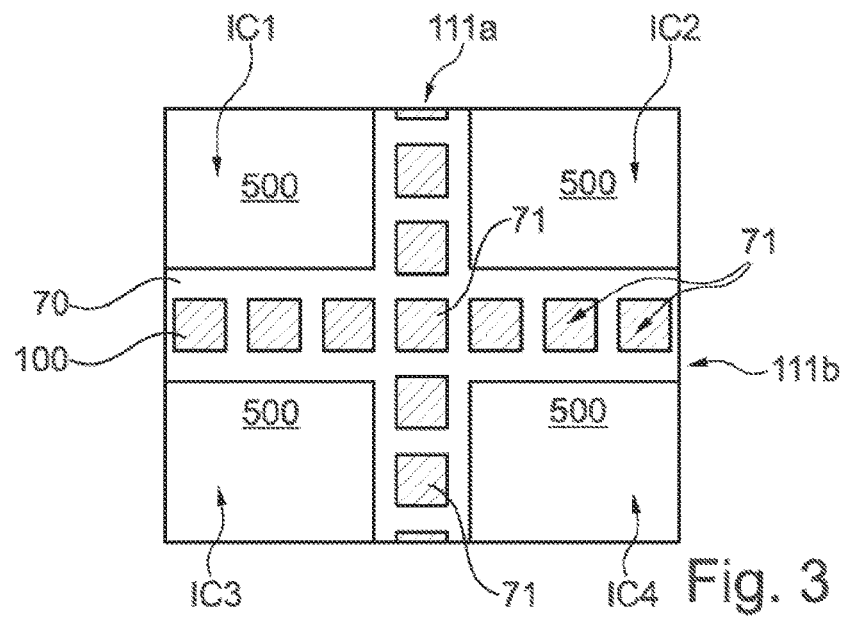
FIG. 3 is a diagrammatic representation of a patterned substrate for a plurality of discrete ICs on a carrier formed in accordance with an embodiment of the process of the invention.

In an alternative embodiment shown in FIG. 3, uniform polyimide substrate is deposited on the glass carrier 100. Using lithographic patterning the polyimide IC substrate areas 500 are defined together with IC connecting areas 70 initially having the same uniform substrate thickness as the IC substrate areas 500. Using etching, the entire thickness of polyimide substrate is removed from a series of patches 71 to expose the underlying carrier 100. In this way, a series of perforations are formed in the substrate in the IC connecting areas such that the channels 111a, 111b comprise sequential areas of substrate and exposed carrier. In this way, the polyimide material lying outside the IC substrate unit 500 boundaries is patterned with holes or other features to form discrete IC substrate units which can be released from the carrier 100 to give single IC substrate units comprising an IC thereon (not shown). This pattern could take the form of perforations to ensure that the ICs separate when and where intended. Singulation of the ICs formed with such partial removal of substrate material connecting adjacent ICs can be achieved at least in part by tearing of the substrate material in the channels 111a, 111b. The substrate in the IC connecting areas 70 surrounding the patches 71 may be the same thickness as the substrate in the IC substrate areas 500. Alternatively a partial thickness of the substrate in the IC connecting areas 70 may be removed, e.g. by etching, as described above in reference to FIG. 2.

When lithography is used to pattern the substrate, smaller distances between IC boundaries (i.e. channels) can be defined than is possible with conventional wafer dicing techniques. Channel line widths can be below 10 μm, reducing substrate waste and increasing the number of ICs which can be formed on one common substrate on a carrier. For example, channels 11, 51 may have widths of between 0.1 μm and 20 μm, between 0.5 μm and 15 μm, or between 5 μm and 10 μm.

In addition, the processes of the present invention are faster and cleaner than conventional wafer formation and dicing methods.

Figure 4A:
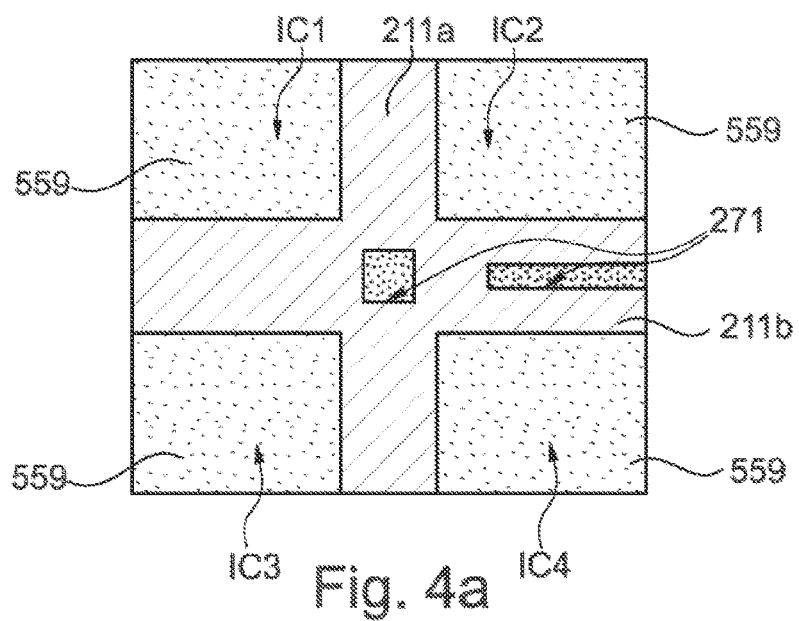
FIGS. 4a to 4c show a plurality of discrete substrate units each having an IC formed thereon on a carrier and one or more structures in one or more channels between adjacent substrate units in accordance with an embodiment of the process of the invention.
Figure 4B:
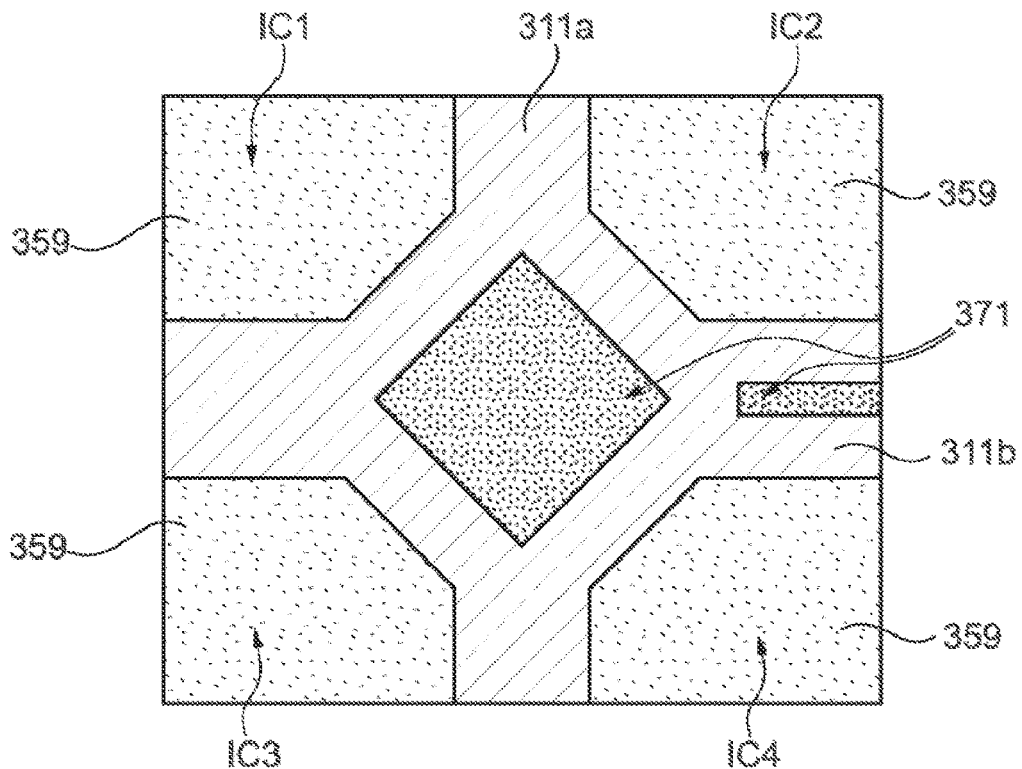
Figure 4C:
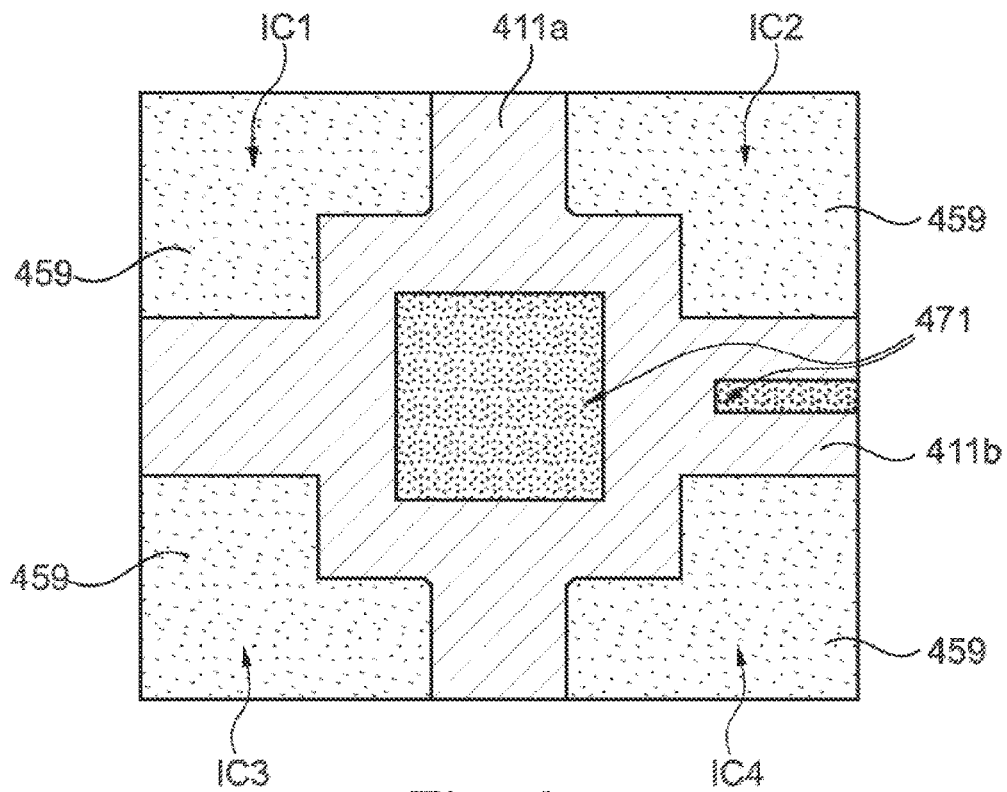

As shown in FIGS. 4a to 4c, the IC connecting area can itself be patterned to include test structures 271, 371, 471 (e.g. fiducials for alignment of masks) or other features (e.g. resistors, capacitors, transistors, or combinations of these, or circuits, e.g. ring oscillators). Thus, when the etching step removes substrate material from the IC connecting areas to form channels 211a, 211b, 311a, 311b and 411a, 411b, between IC substrate units comprising ICs thereon (559, 359, 459) the test structures or other features remain within the channels between the IC substrate units. Such test structures and other features may subsequently be singulated or they may be left on the carrier when the ICs are removed from the carrier.

The test structures 271, 371, 471 or other features may be located between rectangular IC substrate unit 559 corners (FIG. 4a) or between corners of IC substrate units that are shaped to accommodate them with minimal loss in IC surface area in the IC formed on the IC substrate unit 359, 459 (FIGS. 4b, 4c).

In further embodiments (not shown), features (e.g. resistors, capacitors, transistors, or combinations of these, or circuits, e.g. ring oscillators) between IC substrate units upon which ICs are formed can be formed on the substrate or on a layer beneath the substrate, for example on an insulating layer or on the glass carrier itself.

Figure 5:
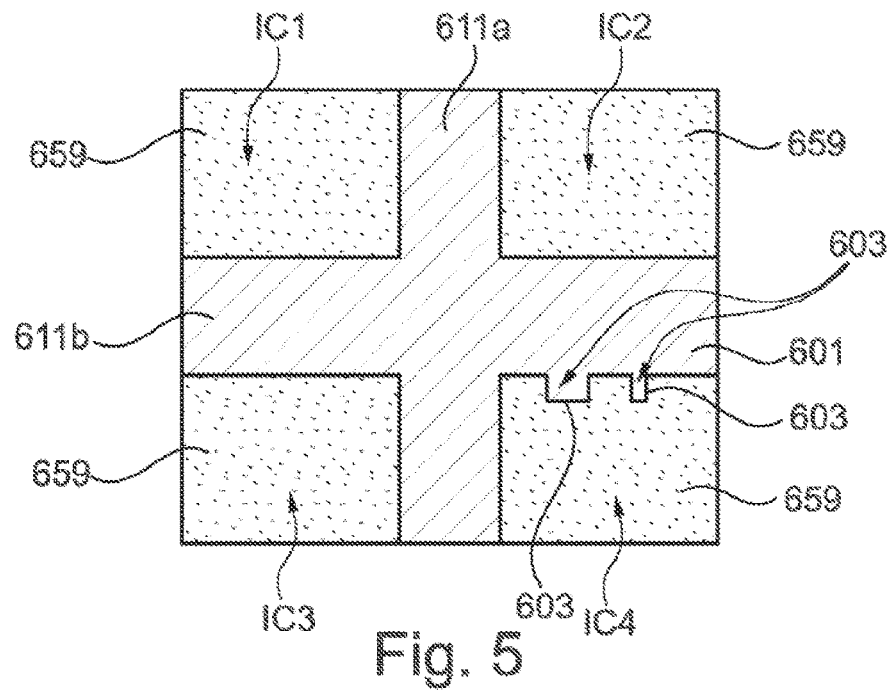
FIG. 5 shows four discrete substrate units on a carrier spaced apart by two intersecting channels, one of the substrate units comprising an edge profile.

ICs and the substrate units on which they are formed may have boundary geometry (i.e. edges) that is not rectangular. As shown in FIG. 5, the boundary of the IC and the IC substrate unit on which it is formed 659 can be profiled with indentation (recesses) 603. The profiled edge may be unique to the substrate units 659 on a single carrier 601 or may be shared within a batch of carriers carrying IC substrate units with a shared edge profile. In this way, the edge (boundary) profiling can be used as a unique identifying feature for a carrier or a batch of carriers.

Figure 6A:
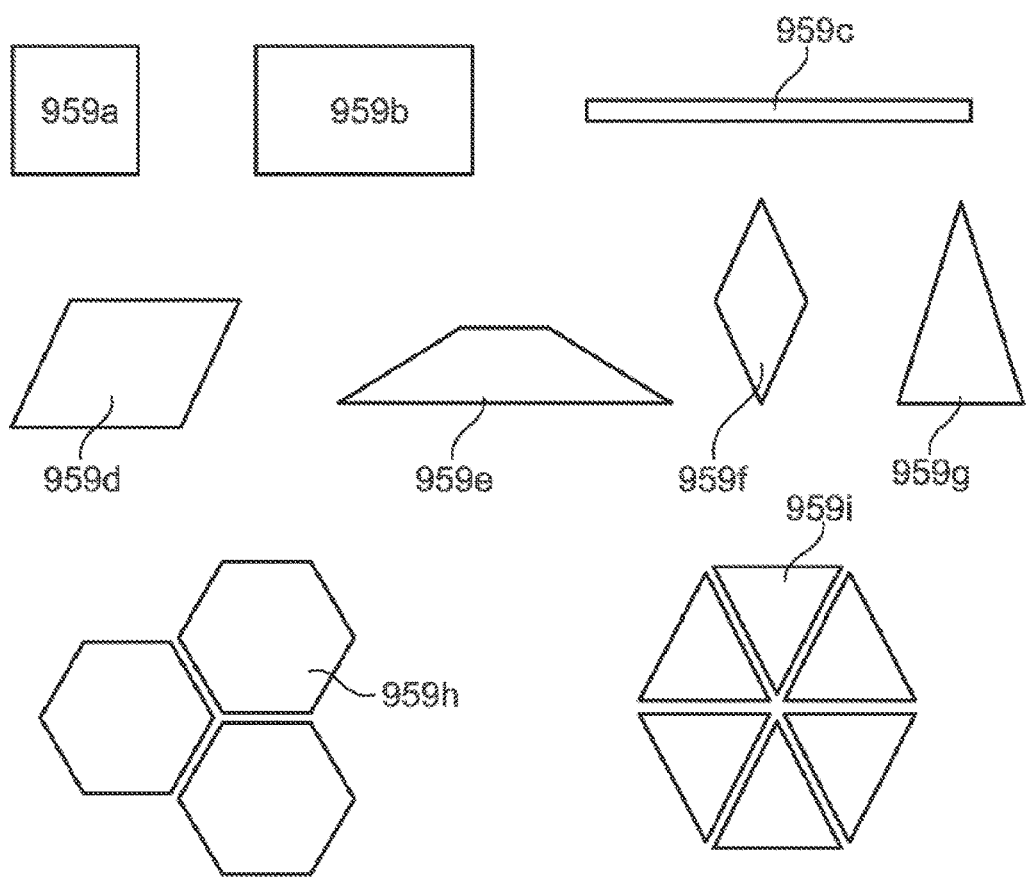
FIGS. 6a to 6e show various embodiments for the shape of the discrete substrate units.
Figure 6B:
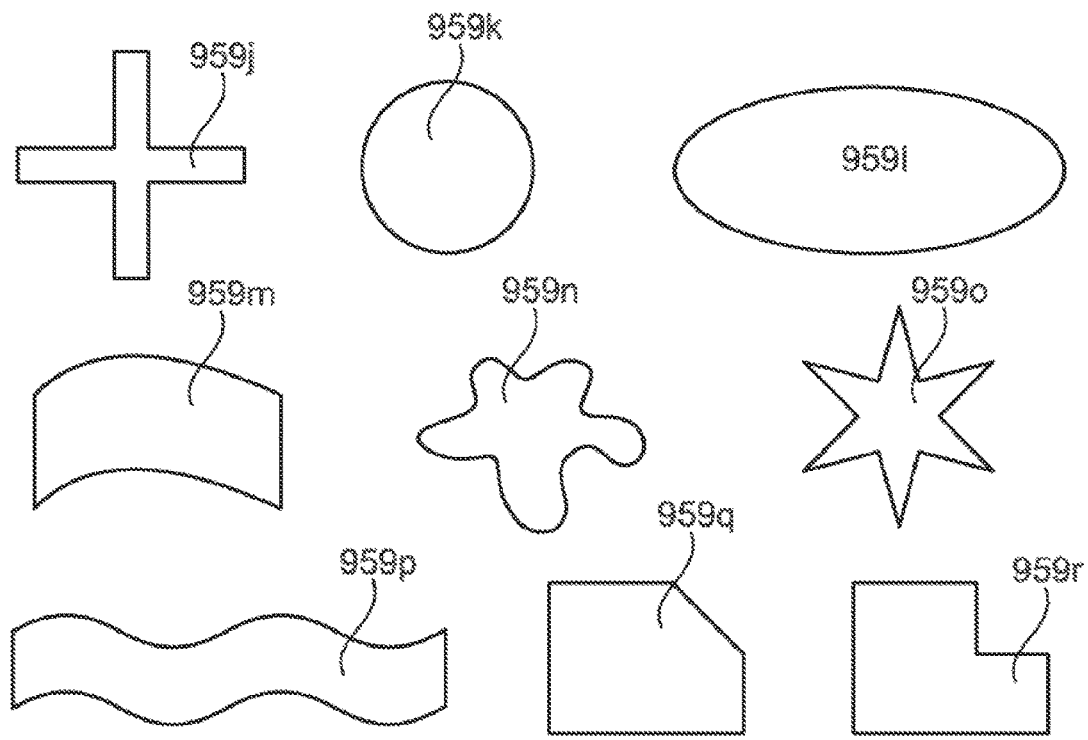
Figure 6C:
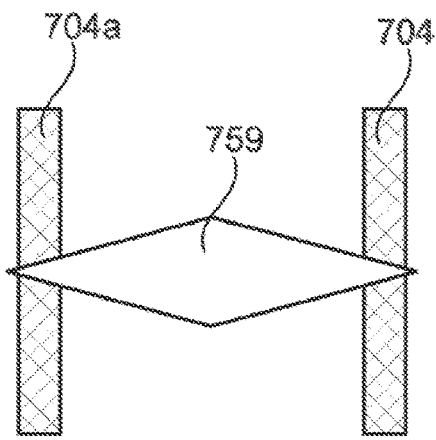
Figure 6D:
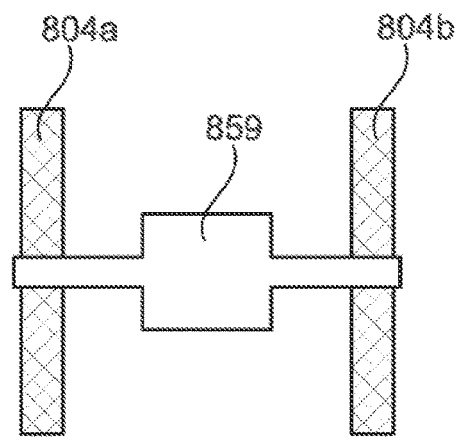

Referring to FIGS. 6a, 6b, 6c, 6d and 6e, the shape of the IC substrate units 5, 50, 500, 559, 359, 459, 659 and the ICs formed thereon can be made to match any application requirements. As best seen in FIGS. 6c and 6d, the IC and IC substrate unit 759 (FIG. 6c) and 859 (FIG. 6d) is shaped such that two or more of its electrical contacts make contact to application circuit contacts 704a, 704b and 804a, 804b respectively that are widely separated. The wide separation of application circuit contacts 704a, 704b and 804a, 804b respectively can be accommodated with a minimum IC surface area.

As shown in FIG. 6a, any tessellating shape may be used to retain efficient use of substrate area. In this way, there is minimum substrate wastage when the IC substrate units are made discrete on the carrier by forming channels between adjacent substrate units. Straight-sided geometries of IC substrate units include regular or irregular triangular, pentagonal, hexagonal, square, rectangular and so on.

As best seen in FIG. 6b, the edges of the IC substrate units and the ICs formed thereon can be curved, concave or convex. In accordance with the embodiment shown in FIG. 5, the edges (boundaries) of the IC substrate units and the ICs formed thereon can incorporate security or traceability features, such as coded edge profiles. By utilising an irregular or non-conventional shape of IC substrate unit and IC formed thereon 959a-i (FIG. 6a) and 959j-r (FIG. 6b) an additional and easily recognisable security and traceability characteristic is provided.

Figure 6E:
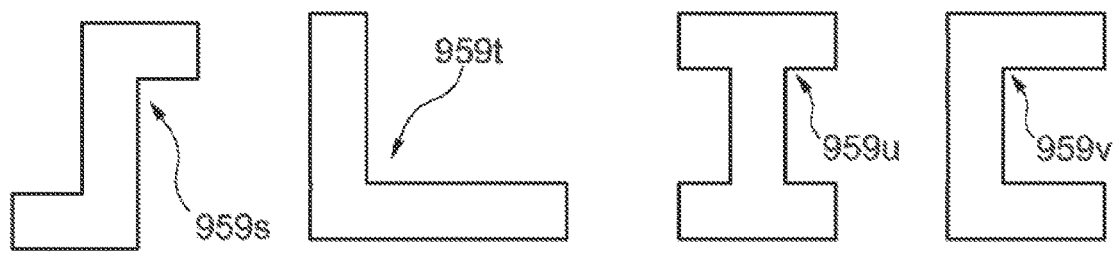

FIG. 6e shows additional straight-sided non-rectangular shapes of IC substrate units and the ICs formed thereon, including a Z-shape 959s, L-shape 959t, I-shape 959u and C-shape 959v. The shape of the IC substrate units and the ICs formed thereon 959s-v can be made to match any application circuit connection requirements. It is envisaged that the IC substrate units and the ICs formed thereon may also take the form of alternative straight-sided shapes such as a W-shape, T-shape, or any other arbitrary shape to fit the requirements of the application circuit such as, but not limited to, the configurational layout of the application circuit.

Figure 9A:
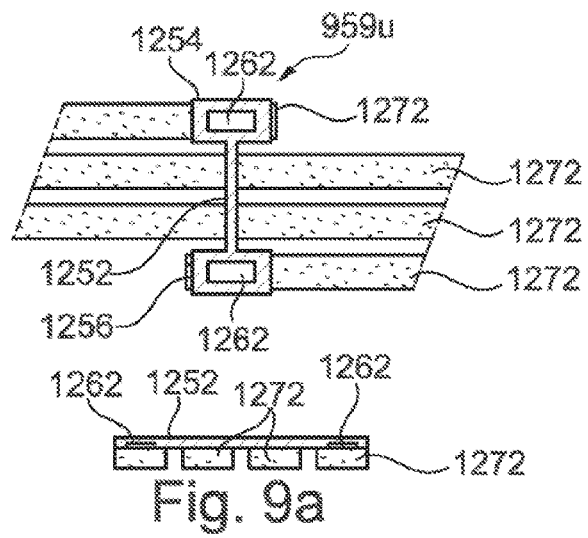
FIGS. 9a to 9d show an IC applied to different configurations of application circuits.
Figure 9B:
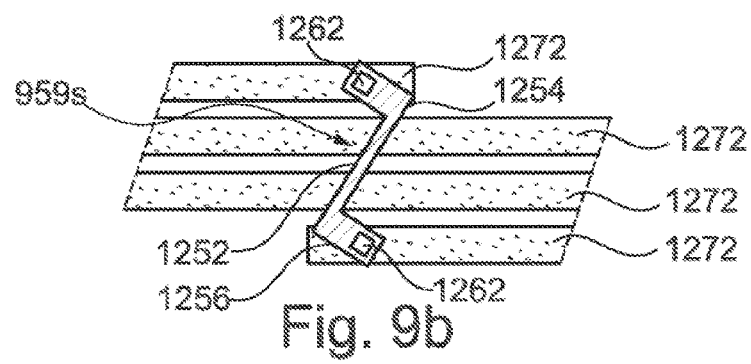
Figure 9C:
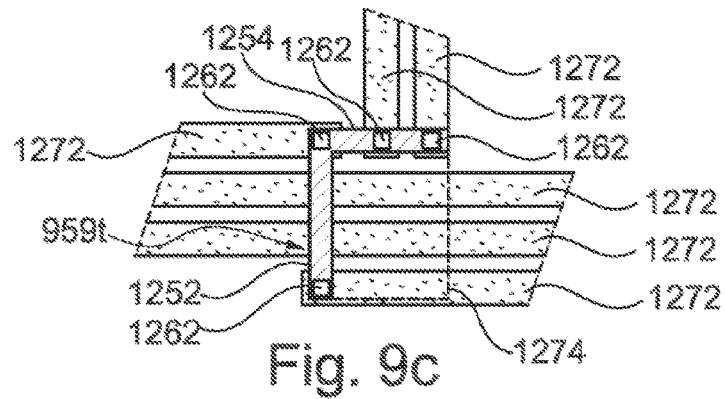
Figure 9D:
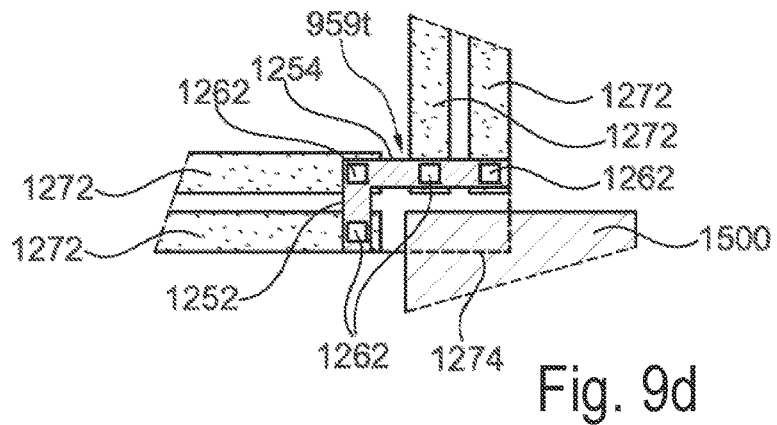

Referring now to FIGS. 9a, 9b, 9c and 9d, the IC substrate units and the ICs formed thereon 959s-v of FIG. 6e are selected to fit different configurations of application circuits 1272. The ICs 959s-v are shaped such that two or more of its electrical contact pads 1262 make contact to application circuit 1272 contacts that are widely separated. Because the IC 959s-v is shaped to be non-rectangular as described, the electrical contact pads 1262 make contact to application circuit 1272 contacts where the application circuit 1272 is orientated in an arbitrary or non-conventional way, such as where the application circuits 1272 are: non-parallel to one another (FIGS. 9c and 9d), non-adjacent to one another (FIGS. 9a-9d), of different lengths and/or widths (FIGS. 9a-9c), separated from one another by additional application circuits (FIGS. 9a-9c) and/or obstructed by an application circuit obstruction 1500 (FIG. 9d). Such shapes of ICs 959s-v remove design constraints on application circuits 1272, facilitating new applications, and reduce the size of the IC footprint compared to a rectangular shaped IC required to connect to the equivalent application circuit 1272. In this way, each IC uses less carrier area, allowing more ICs to be produced per carrier. Thus, manufacturing costs are reduced, as are the costs of the IC itself. The shaped IC 959s-v can be dimensioned for efficient carrier footprint coverage during manufacture, maximising the IC cost reduction potential. An example of this is to provide a tessellated pattern of IC shapes to provide a high packing density on a carrier. The tessellations themselves may be optimised for packing density and/or the ease of removal from the carrier.

FIG. 9a shows an I-shaped IC 959u comprising an insulating bridging portion 1252 having a first laterally extending section 1254 at one end and a second laterally extending section 1256 at the other end. The first and second sections 1252, 1254 each comprise a contact pad 1262. The contact pads 1262 are electrically isolated by an insulating bridging portion 1252 of the body portion. The first section 1254 extends laterally from both sides of the bridging insulating portion 1252. The second section 1256 likewise extends laterally from both sides of the bridging insulating portion 1252. The two contact pads 1262 are in electrical contact with two application circuit 1272 tracks (e.g. end portions). Two interposing application circuit tracks are positioned between the application circuit 1272 tracks contacting the contact pads 1262. The IC 959u forms a bridge to electrically connect the application circuit 1272 tracks (e.g. end portions) via contacting the contact pads 1262, allowing application circuits that cannot be placed immediately adjacent to each other to be connected. In this example, the IC 959u has two contact pads 1262, one contact pad 1262 situated at each end of the body portion, on the first 1254 and second sections 1256 to contact application circuit tracks that are separated by two interposing application circuit tracks, but it should be appreciated that an IC can have more than two contact pads 1262 that are electrically isolated from one another, and can bridge any number of interposing application circuit tracks according to the present disclosure. In this example, the insulating bridging portion 1252 has a width that is less than the width of the other parts of the body portion, i.e. first and second sections 1254 and 1256, to reduce the IC footprint and to save cost. The bridging insulating portion 1252 in this example has a uniform shape, however the bridging insulating portion 1252 may also be a non-uniform shape according to the present disclosure, such as where the bridging insulating portion 1252 has an hourglass shape.

FIG. 9b shows a Z-shaped IC 959s comprising a body portion having a first section 1254 on one end and a second section 1256 and the other end, the first and second sections each locating a contact pad 1262. The contact pads 1262 are electrically isolated by an insulating bridging portion 1252 of the body portion. The first section 1254 extends laterally from one side of the bridging insulating portion 1252 and the second section 1256 extends laterally from the other side of the bridging insulating portion 1252, so as to form a Z-shaped IC 959s. The two contact pads 1262 are in contact with two application circuit 1272 tracks. Two interposing application circuit tracks are positioned between the application circuit 1272 tracks contacting the contact pads 1262. The IC 959s forms a bridge to electrically connect the application circuit 1272 tracks via contacting the contact pads 1262, allowing application circuits that cannot be placed immediately adjacent to each other to be connected. The Z-shaped IC 959s is placed on an application circuit 1272 in an alignment that is rotated to further reduce the size of the IC, whilst allowing the contacts to be placed as far away from each other as possible. The application circuit 1272 tracks have a width and separation. Given that constraint, and the need to squeeze as many ICs onto a wafer as possible, this is particularly advantageous.

FIG. 9c shows a L-shaped IC 959*t* comprising a body portion having a first section 1254 extending laterally from an end of a bridging insulating portion 1252. The L-shaped IC 959*t* in this example has four contact pads 1262. Two contact pads 1262 are located on the first section 1254, a third contact pad 1262 is located at a junction of the bridging insulating portion 1252 and the first section 1254, and the fourth contact pad is located on an end of the bridging insulating portion 1252 opposite the junction of the bridging insulating portion 1252 and the first section 1254. By shaping the IC as a L-shaped IC 959*t*, the size of the IC footprint compared to a rectangular shaped IC 1274 required to connect to the equivalent application circuit 1272 is reduced, allowing more ICs to be produced per wafer. The L-shaped IC 959*t* serves as a reduced-footprint bridge for four application circuit 1272 tracks.

FIG. 9d shows an alternative L-shaped IC 959*t* to the one in FIG. 9c, having a shorter bridging insulating portion 1252 (in this particular example, bridging is understood to "bridge" between application circuit tracks 1272 or contacts, whether or not there are application circuit features, i.e. tracks, components, obstructions, provided between those contacts). The four contact pads 1262 on the IC 959*t* contact four different application circuit tracks 1272. Two contact pads 1262 are located on the first section 1254, a third contact pad 1262 is located at a junction of the bridging insulating portion 1252 and the first section 1254, and the fourth contact pad is located on an end of the bridging insulating portion 1252 opposite the junction of the bridging insulating portion 1252 and the first section 1254. The footprint of the L-shaped IC is smaller compared to the equivalent rectangular shaped IC 1274 required to bridge the equivalent application circuit. The L-shape of the IC allows the IC to avoid contact with an application circuit obstruction 1500, so as to remove design constraints on application circuits having such obstructions 1500, which make the equivalent rectangular shaped IC 1274 impractical or compromising to other aspects of application circuit design. In this example, the application circuit design constraint is an application circuit obstruction 1500, however it is appreciated that another IC or an electronic component, a display or an edge of the application circuit substrate may also, or alternatively, be design constraints that are overcome by the shaped IC. The shaped ICs can be arranged in a tessellated pattern on the carrier so that the number of ICs produced on a single carrier is maximised for efficient carrier coverage during manufacture, maximising the IC cost reduction potential.

In the examples described in FIGS. 9a to 9d, the insulating bridge portion 1252 and the other parts of the IC body portion, i.e. first and second sections 1254 and 1256, form an angle of 90° but it should be appreciated that other angles may be formed, such as an angle more than 0° and less than 180°.

In all examples integrated circuits ICs may be positioned in any one or more of the bridging portion(s) 1252 and the first and second sections 1254 and 1256, and the ICs may connect electrically to contact pads 1262.

Such shaped ICs may be manufactured by the methods of substrate patterning described herein. Alternatively, the shaped ICs may be produced using any conventional method of manufacture and then singulated, either on the carrier or on a flexible support (e.g. a UV release 'wafer frame'), by methods such as laser dicing or mechanical cutting/dicing (e.g. 'cookie cutter' stamping).

FIGS. 7a and 7b each show an IC 1059, 1059' formed on a substrate (not shown) and comprising internal boundaries in the form of apertures 1003, 1003', from which apertures substrate material is removed during etching steps. The apertures 1003, 1003' form one or more through-holes in the IC 1059, 1059' and the underlying substrate to expose the glass carrier 1001, 1001'. The apertures may be singular in each IC or may be patterned in each IC and may be for functional or aesthetic purposes. FIG. 7c shows four such through-holes 1003, 1003' which, in the depicted embodiment, allow adhesive 1005, 1005' to flow through the IC 1059 between its upper face 1007 in which it contacts electrical connections 1015, 1015' and its lower face 1009, through the flexible IC substrate unit 1011 and into contact with electrical connections 1013, 1013' embedded in the glass carrier 1001. In this way, the IC 1059 can be attached to an application circuit or other surface. For example, following formation of the IC 1059, the flexible IC substrate unit 1011 and IC 1059 may be removed from the glass carrier 1001 and placed upon an application circuit such that the through-holes 1003 and/or 1003' are aligned with electrical connections embedded in the application circuit. Conductive adhesive 1005 and/or 1005' may then be applied near to the upper ends of through-holes 1003 and/or 1003' to flow through the IC 1059 between its upper face 1007 in which it contacts electrical connections 1015, 1015' and its lower face 1009, through the flexible IC substrate unit 1011 and into contact with electrical connections 1013, 1013' embedded in the application circuit beneath. Such attachment provides a convenient way to connect electrical connections on the upper face of the IC to electrical connections in an application circuit without inverting the IC.

In the embodiment of FIG. 7d, a conducting adhesive 1005 in through-hole 1003 allows electrical connections to be made between an electrical contact 1015 on the upper face 1007 of the IC 1059 and an electrical contact 1013 on the lower face of the IC substrate unit 1011. The conductive adhesive is located to make further electrical connection with electrical contacts on the surface to which the IC is attached on carrier 1001. In the embodiment shown, electrical contact 1013 is embedded in IC substrate unit 1011 and the glass carrier 1001 comprises a groove 1021 into which the adhesive flows. Similarly to the above example, the IC 1059 can be attached in this way to an application circuit or other surface instead of to the glass carrier 1001, so that electrical contacts 1015 (on the upper face 1007 of the IC 1059) and 1013 (on the lower face of the IC substrate unit 1011) are connected with each other and with further electrical connections via a groove in the application circuit or other surface.

As previously described in the embodiment illustrated in FIGS. 1a-1f, IC substrate units 5 are formed as discrete units on carrier 1 prior to completion of the formation of the IC 9 on the substrate unit. In this embodiment, a lithographic printing technique is used to pattern the polyimide substrate 3 to define a plurality of IC substrate areas 5 spaced apart from one another by a plurality of IC connecting areas 7. The substrate 3 is then removed by etching to expose the carrier 1 and form channels 11 in the substrate 3. The plurality of IC substrate units 5 are spaced apart from one another on the carrier 1 by the channels 11. Layers of an integrated circuit 9 are formed on each of the IC substrate units 5 to form a plurality of discrete integrated circuits 9 on the substrate 3 and spaced apart from each other by the channels 11. Each discrete IC 9 can then be singulated.

As such, measures need to be taken to maintain the small distances, i.e. channels 11, between IC substrate units 5, in particular if thick layer(s) of IC material are etched in a single step.

In certain embodiments, following the initial patterning of the IC substrate units 5, the channels 11 between IC substrate unit boundaries are filled with a material that may be easily removed at the IC singulation stage. This approach is applicable to processes in which the channels 11 between IC substrate units 5 are formed when the flexible substrate is completely removed, and also to processes in which the flexible substrate is only partially removed to form channels 11, such as when flexible substrate material connecting adjacent IC substrate units 5 is left behind, as previously described and illustrated in FIG. 2. The channels 11 are filled completely, i.e. to the level of the upper surface of the substrate units 5, such that the substrate 3 and channels 11 are substantially co-planar. In this way, subsequent processing during IC manufacture is improved. Once the ICs are completed, the material used to fill the channels 11 and the layers deposited on top of them may be removed by chemical processing, e.g. wet or dry etching. Three examples of this alternative approach are described herein.

In a first example, after the substrate units 5 have been patterned and defined by etching or selective deposition of substrate, the channels 11 between the IC substrate units 5 are filled by nickel electroless plating. In this example, the channels 11 are filled by nickel, however it should be appreciated that alternative materials can fill the channels, such as but not limited to copper, silver gold, palladium or other alternatives. This enables the wafer to be substantially planarized, so that any damaging effects arising in subsequent deposition and etching steps in IC manufacture are reduced, or eliminated entirely. Once IC manufacturing is complete, the ICs may be singulated on the carrier 1 using a wet etching, dry etching or other appropriate chemical process, to selectively remove the metal channel fillings and the layers deposited onto them. In this example an etchant can be used to etch the nickel electroless plating, however it shall be appreciated that etchants can be used, such for other materials, or selective etchants that etch certain materials and not others, such as selective etchants for copper and nickel that would not etch aluminium. In this way, the bottom of the channel 11 would be cleared, provided the aspect ratio of the channel 11 is not too high, and the channel 11 is not too narrow.

In another example, the channels 11 between patterned IC substrate units 5 are filled with a polymer that differs from the polymer used to form the substrate units 5. For example, if the substrate units 5 are formed from polyethylene naphtholate (NAP) or polyimide (PI), then the channels 11 may be filled with a different polymer such as polymethyl methacrylate (PMMA) or polyvinyl acetate (PVA). It should be appreciated that further combinations of materials can be used according to the present disclosure. Once ICs are formed on the IC substrate units 5, they may be singulated using a wet etching, dry etching or other appropriate chemical process, to selectively remove the channel-filling polymer. Depending on the processes used to form ICs on the IC substrate units 5, it may be necessary to protect the channel-filling polymer with a capping layer (not shown) to prevent its removal during IC formation. Any such capping layer, if required, may be patterned to align with only the channels 11 between substrate units 5, or may additionally substantially cover the upper surfaces of the substrate units 5. The capping layer may be removed from the channel-filling polymer at an appropriate point prior to singulation.

In a further example, the channels 11 are patterned on the carrier 1 in a metal seeding layer, for example, a copper seeding layer (not shown). In this example, the channels 11 are patterned on the carrier 1 in a metal seeding layer, but it should be appreciated that other metals can be used according to the present disclosure. This step can occur either prior to, or after the substrate 3 is deposited onto the carrier 1 and occurs using a patterning deposition technique such as, but not limited to, lithography, sputtering or any other appropriate technique. The substrate 3 is then deposited, if not done previously, and pattern formed between the channels 11 so that the channels 11 are etched in a substrate layer deposited over the metal seeding layer. In this example, the channels 11 are etched in a substrate layer deposited over the metal seeding layer, but the substrate 3 can alternatively be selective deposited between the metal seeding layer channels. After the IC substrate units 5 have been patterned on the carrier, a thicker layer of metal is grown on the metal seeding layer to fill the channels 11 between the IC substrate units 5. This is performed by a chemical vapour deposition technique, or an alternative technique such as, but not limited to, physical vapour deposition, electroplating or electroless plating.

FIGS. 8a to 8e illustrate an alternative to the above techniques for patterning channels and filling them with metal by instead forming bottom-side contacts or through-chip vertical interconnect accesses (vias). In this alternative, the initial patterning of a metal layer or metal seeding layer 1181 includes internal features within the boundaries of subsequently formed IC substrate units. Metal seeding or metal layer deposition could alternatively be performed after the substrate units and their internal features have been formed. In this example, only the internal features, and not the channel features, are shown for clarity. Once the substrate 1103 and metal or metal seeding layers 1181 have been patterned and the internal features have been cleared of any substrate material, a thicker layer of metal 1183 is grown or deposited on the metal or seeding layer 1181 to substantially fill these features (i.e. the channel features or the internal features) up to the upper surface of the substrate units. During the subsequent process of IC 1109 formation, wiring (not shown), in the form of metal tracks, for the IC may be connected to the metal 1183 deposited onto the internal features. After this (and additional deposition of further layers, singulation and separation from the carrier 1101, if required,) has been completed, the internal features form 'bottom-side contacts" on the underside of the IC.

Referring to FIG. 8a, a metal or metal seeding layer 1181 is patterned and forms internal features. The substrate layer 1103 is then deposited and is patterned and removed from above the metal or seeding layer 1181, as shown in FIG. 8b. Subsequently, a thicker layer of metal 1183 is deposited or grown on top of the metal seeding layer 1181 in order to substantially fill the internal features up to the upper surface of the substrate 1103, as shown in FIG. 8c. Referring now to FIG. 8d, the integrated circuit 1109 is formed on top of the substrate 1103 and metal layer 1183 surface. This provides electrical connections between the IC 1109 and the metal internal features 1181. Though not shown, the pads are connected to application circuits, such as antennas, and can be done so without requiring the IC 1109 to be inverted, which simplifies the whole assembly process.

As seen in FIG. 8e, one or more further layers of metal 1193 can be built on top of the internal features 1181. By doing this, it is possible to produce "through-chip vias", which are conductive features running between the upper surface of the IC 1109 and the lower surface of the IC 1109.

This allows for "stacking" of ICs 1109 and/or other components in the same physical area, or overlapping areas, on an application circuit and which saves area and reduces metal tracking of interconnects and reduces cost of the application circuit. It also eliminates the need for "crossovers" in metal tracking on the application circuit, which reduces the number of required fabrication steps. Pads can be manufactured in two different ways—either the metal first, as described above, or the substrate first.

For the metal-first approach, metal contact pads 1181 are deposited and patterned directly on the glass carrier 1101 before spin-coating a substrate 1103. Vias, which may be smaller than or equal to the contact pads in area, are then etched through the film using an appropriate process, such as oxygen plasma dry etching for polyimide substrates, and connections are made to the upper IC layers 1109. These connections 1183, 1193 are made with an upper metal layer that routes over positively sloped sidewalls around the etched vias to form connections, or by methods to fill the vias, such as electro/electroless plating techniques. In this particular example, the vias in the substrate connecting to the bottom pad may consist of a limited area, with the pad 1181 extending beyond them.

Alternatively, in adopting a substrate-first approach, the substrate 1103 is deposited on the glass carrier, and the vias are etched with positive sidewalls. A metal 1183 is then deposited, so that no breakages occur at the via edges. The metal 1183 is routed down to contact the glass carrier 1101 and up to the top of the substrate, and ultimately to the upper surface of the IC 1109. The bottom pad area is defined in this method by the size of the via, so it is preferred that the substrate has relatively large etched regions.

To ensure proper release of the metal contact pad areas from the carrier, a release layer is provided underneath the metal pad, and is designed to interact with a laser used for release and results in complete release of the metal pad area. In this example, the metal pad comprises aluminium and the release layer comprises titanium, but it is envisaged that alternative materials can be used according to the present disclosure.

In embodiments the pattern of the internal boundaries in the IC substrate unit and the IC formed thereon may form further security and/or traceability features.

The discrete IC substrate units and ICs formed thereon are singulated by releasing them from the carrier. The release process may be an infrared electromagnetic radiation release process, a heat release or a mechanical peel release process.

The discrete IC substrate units and ICs formed thereon on a carrier can be released from the carrier individually or linked to one or more adjacent discrete IC substrate units and ICs formed thereon.

Below, there is provided a non-exhaustive list of non-limiting clauses. Any one or more of the features of these examples may be combined with any one or more features of another clause, embodiment or aspect described herein.

Aspects:

1. A process for manufacturing a plurality of discrete integrated circuits (ICs) on a carrier, the process comprising the steps of:
    providing a carrier for a flexible substrate;
    depositing a flexible substrate of uniform thickness on said carrier;
    patterning said uniform thickness flexible substrate to define a plurality of IC substrate areas spaced apart from one another by a plurality of IC connecting areas;
    removing at least a portion of the thickness of the flexible substrate from at least a portion of the IC connecting areas to form channels in the flexible substrate and a plurality of IC substrate units spaced apart from one another on the carrier by said channels;
    forming an integrated circuit on at least one of the IC substrate units.

2. A process for manufacturing a plurality of discrete integrated circuits (ICs) on a carrier, the process comprising the steps of:
    providing a carrier for a flexible substrate;
    depositing a flexible substrate of uniform thickness on said carrier;
    patterning said uniform thickness flexible substrate to define a plurality of IC substrate areas spaced apart from one another by IC connecting areas;
    forming a portion of an integrated circuit on at least one of the IC substrate areas;
    removing at least a portion of the thickness of the flexible substrate from at least a portion of the IC connecting areas to form channels in the flexible substrate and a plurality of IC substrate units spaced apart from one another on the carrier by said channels; and
    completing the formation of the integrated circuit on the at least one of the IC substrate areas.

3. A process according to aspect 1 or aspect 2, comprising forming integrated circuits on each of the IC substrate units.

4. A process according to any one of aspects 1 to 3, wherein each IC substrate unit comprises flexible substrate of uniform thickness.

5. A process according to any one of aspects 1 to 4, comprising the step of: removing the entire thickness of the flexible substrate from all of each of the IC connecting areas so as to form a plurality of substrate-free channels on the carrier between each of the IC substrate units on the carrier.

6. A process according to any one of aspects 1 to 4, comprising removing the entire thickness of the flexible substrate from a portion of each of the IC connecting areas so as to form a plurality of patterned channels on the carrier wherein at least one channel is formed between each of the IC substrate units.

7. A process according to any one of aspects 1 to 4, comprising removing a first portion of the thickness of the flexible substrate from a first portion of each of the IC connecting areas and removing a second portion of the thickness of the flexible substrate from a second, different portion of each of the IC connecting areas, wherein the first portion is of greater thickness than the second portion.

8. A process according to aspect 6 or aspect 7, comprising forming perforation lines between adjacent IC substrate units in the IC connecting areas by sequentially removing and leaving the entire thickness of the flexible substrate along each of the IC connecting areas so as to form a plurality of patterned channels on the carrier wherein at least one channel is formed between each of the IC substrate units.

9. A process according to aspect 6 or aspect 7, comprising forming perforation lines between adjacent IC substrate units in the IC connecting areas by sequentially removing a first portion of the thickness of the flexible substrate from a first portion of each of the IC connecting areas and removing a second portion of the thickness of the flexible substrate from a second, different portion of each of the IC connecting areas, wherein the first portion is of greater thickness than the second portion.

10. A process according to aspect 6 or aspect 7, comprising forming perforation lines between adjacent IC substrate units in the IC connecting areas. by sequentially removing the entire thickness of the flexible substrate and a partial thickness of the flexible substrate along each of the IC connecting areas so as to form a plurality of patterned channels on the carrier wherein at least one channel is formed between each of the IC substrate units.

11. A process according to any one of aspects 1 to 4 and aspect 6, comprising forming at least one structure in the IC connecting areas by removing the entire thickness of the flexible substrate from a portion of each of the IC connecting areas so as to form a channel having at least one structure of flexible substrate in the channel, the structure being spaced apart from the IC substrate units adjacent to the channel.

12. A process according to aspect 11, wherein the structure is a test structure.

13. A process according to any one of the preceding aspects, wherein the IC substrate units on the carrier are uniform in shape.

14. A process according to aspect 14, wherein the IC substrate units are polygonal.

15. A process according to any one of aspects 1 to 13, wherein the IC substrate units are irregular in shape.

16. A process according to any one of the preceding aspects, wherein at least one edge of at least one of the IC substrate units on the carrier comprises at least one indentation.

17. A process according to aspect 16, wherein the edge comprises a series of indentations.

18. A process according to any one of the preceding aspects, wherein the carrier is rigid.

19. A process according to aspect 18, wherein the carrier is glass, polycarbonate or quartz.

20. A process according to any one of aspects 1 to 18, wherein the carrier is flexible.

21. A process according to aspect 20, wherein the carrier is a flexible release tape.

22. A process according to any one of the preceding aspects, wherein at least a portion of the flexible substrate is removed from the IC connecting areas to form channels in a pattern at predetermined location(s) on the carrier.

23. A process according to aspect 22, wherein the pattern is formed of a series of intersecting channels extending between the edges of the carrier.

24. A process according to aspect 22 or aspect 23, wherein the pattern of channels is uniform across the carrier.

25. A process according to aspect 22 or aspect 23, wherein the pattern of channels is non-uniform across the carrier.

26. A process according to any one of the preceding aspects, wherein the flexible substrate is formed of a single layer.

27. A process according to any one of the preceding aspects, wherein the flexible substrate material is a polymer.

28. A process according to any one of aspects 1 to 26, wherein the flexible substrate material comprises one or more of polyimide, polyethylene terephthalate (PET), parylene, benzocyclobutene, Cytop™, negative epoxy photoresist, hydrogen silsesquioxane (HSQ) and Polyaryletheretherketone (PEEK)

29. A process according to any one of aspects 1 to 25, wherein the flexible substrate comprises a layered structure comprising two polymer substrate layers spaced apart from one another by an interlayer.

30. A process according to any one of aspects 1 to 26, wherein the flexible substrate material comprises one or more of: a metal oxide, a metal phosphate, a metal sulphates, a metal sulphite, a metal nitride, a metal oxynitride, an inorganic insulator and a spinnable glass.

31. A process according to any one of the preceding aspects, wherein the interface between the carrier and the flexible substrate is formed by direct adhesion of the flexible substrate to the carrier.

32. A process according to any one of aspects 1 to 30, wherein the interface comprises an interlayer.

33. A process according to aspect 32, wherein the interlayer comprises an adhesive.

34. A process according to aspect 32 or aspect 33, wherein the interlayer comprises titanium metal.

35. A process according to any one of aspects 32 to 34, wherein the interlayer is patterned.

36. A process according to any one of the preceding aspects, comprising the step of singulating the IC substrate units by releasing each of them from the carrier following the completion of the IC formation process thereon.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A process to manufacture a plurality of discrete integrated circuits (ICs) on a carrier, the process comprising:
   providing a carrier for a flexible substrate;
   depositing a flexible substrate of uniform thickness on the carrier;
   patterning the uniform thickness flexible substrate to define a plurality of IC substrate areas spaced apart from one another by a plurality of IC connecting areas;
   (i) removing at least a portion of the thickness of the flexible substrate from at least a portion of the IC connecting areas to form channels in the flexible substrate and a plurality of IC substrate units spaced apart from one another on the carrier by the channels; and
   (ii) forming an integrated circuit on at least one of the IC substrate units,
   wherein step (i) precedes step (ii) and wherein the forming of the integrated circuit on the at least one of the IC substrate units includes separately depositing a plurality of layers of the integrated circuit on the at least one of the IC substrate units.

2. The process according to claim 1, further comprising forming integrated circuits on each of the IC substrate units.

3. The process according to claim 1, wherein each IC substrate unit comprises flexible substrate of uniform thickness.

4. The process according to claim 1, further comprising: removing the entire thickness of the flexible substrate from all of each of the IC connecting areas so as to form a plurality of substrate-free channels on the carrier between each of the IC substrate units on the carrier.

5. The process according to claim 1, further comprising removing the entire thickness of the flexible substrate from a portion of each of the IC connecting areas so as to form a plurality of patterned channels on the carrier wherein at least one channel is formed between each of the IC substrate units.

6. The process according to claim 1, further comprising removing a first portion of the thickness of the flexible substrate from a first portion of each of the IC connecting areas and removing a second portion of the thickness of the flexible substrate from a second, different portion of each of the IC connecting areas, wherein the first portion is of greater thickness than the second portion.

7. The process according to claim 5, further comprising forming perforation lines between adjacent IC substrate units in the IC connecting areas by sequentially removing and leaving the entire thickness of the flexible substrate along each of the IC connecting areas so as to form a plurality of patterned channels on the carrier wherein at least one channel is formed between each of the IC substrate units.

8. The process according to claim 5, further comprising forming perforation lines between adjacent IC substrate units in the IC connecting areas by sequentially removing a first portion of the thickness of the flexible substrate from a first portion of each of the IC connecting areas and removing a second portion of the thickness of the flexible substrate from a second, different portion of each of the IC connecting areas, wherein the first portion is of greater thickness than the second portion, or comprising forming perforation lines between adjacent IC substrate units in the IC connecting areas by sequentially removing the entire thickness of the flexible substrate and a partial thickness of the flexible substrate along each of the IC connecting areas so as to form a plurality of patterned channels on the carrier wherein at least one channel is formed between each of the IC substrate units.

9. The process according to claim 1, further comprising forming at least one structure in the IC connecting areas by removing the entire thickness of the flexible substrate from a portion of each of the IC connecting areas so as to form a channel having at least one structure of flexible substrate in the channel, the structure being spaced apart from the IC substrate units adjacent to the channel, or wherein a formed structure is a test structure.

10. The process according to claim 1, wherein the IC substrate units on the carrier are:
uniform or irregular in shape, and/or
polygonal.

11. The process according claim 1, wherein at least one edge of at least one of the IC substrate units on the carrier comprises at least one indentation, or wherein the edge comprises a series of indentations.

12. The process according to claim 1, wherein the carrier is rigid, or wherein the carrier is glass, polycarbonate or quartz.

13. The process according to claim 1, wherein the carrier is flexible, or wherein the carrier is a flexible release tape.

14. The process according to claim 1, wherein one or more of: at least a portion of the flexible substrate is removed from the IC connecting areas to form channels in a pattern at predetermined location(s) on the carrier, the pattern is formed of a series of intersecting channels extending between the edges of the carrier, the pattern of channels is uniform across the carrier, and the pattern of channels is non-uniform across the carrier.

15. The process according to claim 1, wherein the flexible substrate is formed of a single layer, or wherein the flexible substrate comprises a layered structure comprising two polymer substrate layers spaced apart from one another by an interlayer.

16. The process according to claim 1, wherein the flexible substrate material comprises a polymer, or one or more of polyimide, polyethylene terephthalate (PET), parylene, benzocyclobutene, amorphous fluoropolymer, negative epoxy photoresist, hydrogen silsesquioxane (HSQ) and Polyaryletheretherketone (PEEK), or one or more of: a metal oxide, a metal phosphate, a metal sulphates, a metal sulphite, a metal nitride, a metal oxynitride, an inorganic insulator and a spinnable glass.

17. The process according to claim 1, wherein an interface between the carrier and the flexible substrate is formed by direct adhesion of the flexible substrate to the carrier.

18. The process according to claim 1, wherein one or more of: an interface comprises an interlayer, the interlayer comprises an adhesive, the interlayer comprises titanium metal, and the interlayer is patterned.

19. The process according to claim 1, further comprising singulating the IC substrate units by releasing each of them from the carrier following the completion of the IC formation process thereon.

20. A process to manufacture a plurality of discrete integrated circuits (ICs) on a carrier, the process comprising:
providing a carrier for a flexible substrate;
depositing a flexible substrate of uniform thickness on the carrier;
patterning the uniform thickness flexible substrate to define a plurality of IC substrate areas spaced apart from one another by IC connecting areas;
forming a portion of an integrated circuit on at least one of the IC substrate areas, wherein the forming of the portion of the integrated circuit on the at least one of the IC substrate units includes separately depositing a plurality of layers of the integrated circuit on the at least one of the IC substrate units:
removing at least a portion of the thickness of the flexible substrate from at least a portion of the IC connecting areas to form channels in the flexible substrate and a plurality of IC substrate units spaced apart from one another on the carrier by the channels; and
completing the formation of the integrated circuit on the at least one of the IC substrate areas.

* * * * *